(12) United States Patent
Wang et al.

(10) Patent No.: US 10,580,591 B2
(45) Date of Patent: Mar. 3, 2020

(54) METAL-OXIDE ANCHORED GRAPHENE AND CARBON-NANOTUBE HYBRID FOAM

(71) Applicant: The Regents of The University of California, Oakland, CA (US)

(72) Inventors: Wei Wang, Newport Beach, CA (US); Shirui Guo, Riverside, CA (US); Cengiz S Ozkan, San Diego, CA (US); Mihrimah Ozkan, San Diego, CA (US)

(73) Assignee: THE REGENTS OF CALIFORNIA, RIVERSIDE, Oakland, CA (US)

( * ) Notice: Subject to any disclaimer, the term of this patent is extended or adjusted under 35 U.S.C. 154(b) by 0 days.

(21) Appl. No.: 15/034,400

(22) PCT Filed: Nov. 5, 2013

(86) PCT No.: PCT/US2013/068577
§ 371 (c)(1),
(2) Date: May 4, 2016

(87) PCT Pub. No.: WO2015/069227
PCT Pub. Date: May 14, 2015

(65) Prior Publication Data
US 2016/0268061 A1    Sep. 15, 2016

(51) Int. Cl.
*H01G 11/36*    (2013.01)
*H01G 11/46*    (2013.01)
(Continued)

(52) U.S. Cl.
CPC ............ *H01G 11/36* (2013.01); *C01B 32/16* (2017.08); *C01B 32/186* (2017.08); *C01G 45/02* (2013.01);
(Continued)

(58) Field of Classification Search
CPC .......... H01G 4/30; H01G 11/36; H01G 11/46
See application file for complete search history.

(56) References Cited

U.S. PATENT DOCUMENTS 6,329,296 B1    12/2001    Ruby et al.
8,535,830 B2     9/2013    Lee et al.
(Continued)

FOREIGN PATENT DOCUMENTS

CN    1951799 A    4/2007
CN    101122040 A    2/2008
(Continued)

OTHER PUBLICATIONS

Kim et al., "Highly dispersed ruthenium oxide nanoparticles on carboxtlated carbon nanotubes for supercapacitor electrode materials", 2005, Journal of Materials Chemistry, 15, 4914-4921.*
(Continued)

*Primary Examiner* — Eric W Thomas
(74) *Attorney, Agent, or Firm* — Schwegman Lundberg & Woessner, P.A.

(57) ABSTRACT

A metal oxide anchored graphene and carbon nanotube hybrid foam can be formed via a two-step process. The method can include forming at least one graphene layer and a plurality of carbon nanotubes onto a surface of a porous metal substrate by chemical vapor deposition to form a coated porous metal substrate, and depositing a plurality of metal oxide nanostructures onto a surface of the coated porous metal substrate to form the metal oxide anchored graphene and carbon nanotube hybrid foam.

15 Claims, 21 Drawing Sheets

(51) Int. Cl.

| | |
|---|---|
| *H01G 11/84* | (2013.01) |
| *H01G 11/22* | (2013.01) |
| *H01M 4/133* | (2010.01) |
| *C01G 55/00* | (2006.01) |
| *C01G 45/02* | (2006.01) |
| *C01B 32/186* | (2017.01) |
| *C01B 32/16* | (2017.01) |
| *C23C 16/26* | (2006.01) |
| *C23C 16/56* | (2006.01) |
| *H01G 11/26* | (2013.01) |
| *H01G 11/52* | (2013.01) |
| *H01G 11/86* | (2013.01) |
| *H01M 4/04* | (2006.01) |
| *H01M 4/36* | (2006.01) |
| *H01M 4/50* | (2010.01) |
| *H01M 4/583* | (2010.01) |
| *H01M 4/02* | (2006.01) |

(52) U.S. Cl.
CPC ............ *C01G 55/004* (2013.01); *C23C 16/26* (2013.01); *C23C 16/56* (2013.01); *H01G 11/26* (2013.01); *H01G 11/46* (2013.01); *H01G 11/52* (2013.01); *H01G 11/86* (2013.01); *H01M 4/0428* (2013.01); *H01M 4/133* (2013.01); *H01M 4/366* (2013.01); *H01M 4/50* (2013.01); *H01M 4/583* (2013.01); *C01P 2002/72* (2013.01); *C01P 2002/85* (2013.01); *C01P 2004/04* (2013.01); *C01P 2004/13* (2013.01); *C01P 2004/16* (2013.01); *C01P 2004/24* (2013.01); *C01P 2006/40* (2013.01); *H01M 2004/021* (2013.01); *Y02E 60/13* (2013.01)

(56) References Cited

U.S. PATENT DOCUMENTS

| | | | |
|---|---|---|---|
| 2010/0002402 A1 | 1/2010 | Rogers et al. | |
| 2011/0043037 A1* | 2/2011 | Mcilroy | H01G 9/048 307/48 |
| 2011/0255214 A1* | 10/2011 | Gruner | B82Y 30/00 361/502 |
| 2011/0304955 A1* | 12/2011 | Zhou | B82Y 30/00 361/541 |
| 2012/0121891 A1 | 5/2012 | Kim et al. | |
| 2012/0134071 A1* | 5/2012 | Sadoway | B82Y 30/00 361/502 |
| 2012/0236467 A1* | 9/2012 | Kang | B82Y 10/00 361/502 |
| 2012/0250225 A1* | 10/2012 | Aria | B82Y 10/00 361/502 |
| 2012/0313591 A1 | 12/2012 | Brambilla et al. | |

FOREIGN PATENT DOCUMENTS

| | | |
|---|---|---|
| CN | 101714463 A | 5/2010 |
| CN | 102568855 A | 7/2012 |
| CN | 102709056 A | 10/2012 |
| CN | 106463276 A | 2/2017 |
| JP | 2004030473 A | 1/2004 |
| JP | 2004304073 A | 10/2004 |
| JP | 2005138204 A | 6/2005 |
| JP | 6500018 B2 | 3/2019 |
| KR | 1020160083060 A | 7/2016 |
| TR | 201605860 B | 7/2018 |
| WO | WO-2012112818 A2 | 8/2012 |
| WO | WO-2013070989 A1 | 5/2013 |
| WO | WO-2013119295 A1 | 8/2013 |
| WO | WO-2013119295 A9 | 8/2013 |
| WO | WO-2015069227 A1 | 5/2015 |

OTHER PUBLICATIONS

McKeown et al., "Structure of Hydrous Ruthenium Oxides: Implications for Charge Storage", 1999, J. Phys. Chem. B., 103, 4825-4832.*

Lee et al., "Hierarchically grown single crystalline RuO2 nanorods on vertically aligned few-walled carbon nanotubes", Materials Letter, 89 (2012) p. 115-117. (Year: 2012).*

Lin et al., "Superior Capacitive Characteristics of RuO2 nanorods grown on carbon nanotubes", Applied Surface Science, 256 2009) 1042-1045 (Year: 2009).*

"International Application Serial No. PCT/US2013/068577, International Search Report dated Apr. 4, 2014", 2 pgs.

"International Application Serial No. PCT/US2013/068577, Written Opinion dated Apr. 4, 2014", 7 pgs.

International Application Serial No. PCT/US2013/068577, International Preliminary Report on Patentability dated May 19, 2016, 9 pgs.

Japanese Application Serial No. 2016-526768, Office Action dated Sep. 26, 2017, 8 pgs.

Japanese Application Serial No. 2016-526768, Voluntary Amendment filed Jun. 28, 2016, 4 pgs.

Chinese Application Serial No. 201380081562.7, Office Action dated Dec. 18, 2017, With English Abstract, 17 pgs.

Japanese Application Serial No. 2016-526768, Response Filed Dec. 25, 2017 to Office Action dated Sep. 26, 2017, (W/ English Claims), 11 pgs.

"Chinese Application Serial No. 201380081562.7, Response filed May 2, 2018 to Office Action dated Dec. 18, 2017", W/ English Claims, 12 pgs.

"Japanese Application Serial No. 2016-526768, Office Action dated Jun. 5, 2018", w/ English translation, 8 pgs.

Chinese Application Serial No. 201380081562.7, Office Action dated Feb. 14, 2019, w/ English translation, 17 pgs.

Chinese Application Serial No. 201380081562.7, Office Action dated Aug. 24, 2018, w/ English translation, 18 pgs.

Chinese Application Serial No. 201380081562.7, Response filed Apr. 15, 2019 to Office Action dated Feb. 14, 2019, W/ English Claims, 10 pgs.

Chinese Application Serial No. 201380081562.7, Response filed Nov. 7, 2018 to Office Action dated Aug. 24, 2018, W/ English Claims, 9 pgs.

Japanese Application Serial No. 2016-526768, Response filed Sep. 4, 2018 to Office Action dated Jun. 5, 2018, W/ English Claims, 11 pgs.

Chinese Application Serial No. 201380081562.7, Decision of Rejection dated May 22, 2019, W/English Translation, 15 pgs.

"Chinese Application Serial No. 201380081562.7, Request for Reexamination filed Sep. 4, 2019 to Decision of Rejection dated May 22, 2019", w/ English Claims, 10 pgs.

"Chinese Application Serial No. 201380081562.7, Office Action dated Sep. 30, 2019", w/ English Translation, 7 pgs.

"Chinese Application Serial No. 201380081562.7, Response Nov. 28, 2019 to Office Action dated Sep. 30, 2019", w/ English Claims, 9 pgs.

"Chinese Application Serial No. 201380081562.7, Response filed Dec. 20, 2019 to Examiner's Telephone Interview", w/ English Claims, 35 pgs.

"Korean Application Serial No. 10-2016-7014795, Notice of Preliminary Rejection dated Oct. 28, 2019", w/ English Translation, 13 pgs.

* cited by examiner

METAL-OXIDE ANCHORED GRAPHENE AND CARBON-NANOTUBE HYBRID FOAM

RELATED APPLICATION

This application is a U.S. National Stage Filing under 35 U.S.C. 371 from International Patent Application Serial No. PCT/U.S.2013/068577, filed on Nov. 5, 2013, and published on May 14, 2015 as WO 2015/069227, which is incorporated by reference herein in its entirety.

TECHNICAL FIELD

This document relates generally to metal oxide anchored graphene and carbon nanotube hybrid foam and, in particular, to ruthenium (IV) oxide and manganese (IV) oxide anchored graphene and carbon nanotube hybrid foams for use in energy devices.

BACKGROUND

The two main types of energy devices can include energy storage devices and energy generating devices. Examples of the energy storage devices can include electrochemical capacitors and batteries. Examples of the electrochemical capacitors can include an electric double layer capacitor and a pseudocapacitor. The electric double layer capacitor can use an activated carbon as a polarizable electrode and can utilize an electric double layer formed at an interface between a pore surface of the activated carbon and an electrolytic solution. The pseudocapacitor can use a transition metal oxide, whose valence continuously changes, and an electrically-conductive polymer which can be doped. Moreover, two main types of the batteries can include a secondary battery, which can be charged and discharge by utilizing intercalation and chemical reactions of active materials, and a primary battery, which is not rechargeable after being discharged once.

OVERVIEW

Among energy storage devices, supercapacitors (also known as electric double layer capacitors or ultracapacitors) have been attracting interest because they can provide higher power density compared to batteries and higher energy density compared to other types of energy storage devices such as batteries and fuel cells. Supercapacitors also provide an increased charge and discharge rate, increased stability, and increased cycle life. However, previous supercapacitors can have a lower energy density compared to other energy storage devices (e.g., batteries and fuel cells), and generally are used as part of a hybrid system with other energy storage devices.

Various examples of the present disclosure can provide for an energy device (e.g., a metal oxide anchored graphene and carbon nanotube hybrid foam (also referred to herein as "hybrid foam")). The hybrid foam of the present disclosure can provide many advantages over the other energy devices (e.g., previous supercapacitors, batteries, and fuel cells). For example, the hybrid foam of the present disclosure can provide an increased energy density as compared to previous supercapacitors and an increased power density as compared to batteries and fuel cells. Further, the hybrid foam of the present disclosure can provide increased capacitance performance, increased charging and discharging rates, and manufacturability for high-performance, commercial applications.

The hybrid foam of the present disclosure integrates metal oxide nanostructures such as ruthenium (IV) oxide ($RuO_2$) nanoparticles or manganese (IV) oxide ($MnO_2$) nanowires onto a porous metal substrate (e.g., a foam substrate) coated with at least one graphene layer and carbon nanotubes. The hybrid foam demonstrates increased gravimetric capacitance and a real capacitance. The hybrid foam can provide an increased surface area for the loading of the metal oxide particles and facilitate electrolyte infiltration. For example, the hybrid foam can demonstrate a hierarchical and porous metal substrate that can allow the electrolyte to access active materials. The carbon nanotubes can act as a conductive framework such that the seamless connections at the graphene and carbon nanotube interface can increase the conductivity and charge transport. Increased electrolyte access, increased conductivity, and increased charge transport can provide a high active material utilization, decreased internal resistance, increased rate handability, and increased cycling stability.

Supercapacitors based on the hybrid foam of the present disclosure can increase specific capacitance and extend the operational voltage window. The supercapacitors based on the hybrid foam can increase a maximum energy density and a power density. Further, supercapacitors based on the hybrid foam can show an increase in cycling stability.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure provides for a hybrid foam including at least one layer of graphene, a plurality of carbon nanotubes, and metal oxide nanostructures. In one example, the hybrid foam includes ruthenium (IV) oxide ($RuO_2$) nanoparticles. In another example, the hybrid foam includes manganese (IV) oxide ($MnO_2$) nanowires. The hybrid foams of the present disclosure can be prepared by a two-step process. For example, the two-step process can include chemical vapor deposition of the at least one layer of graphene and the plurality of carbon nanotube and a simple bath deposition of the metal oxide nanostructures. This method of preparing electrodes offers a facile, scalable and a low-cost approach for high energy density supercapacitor applications.

Figure 1:
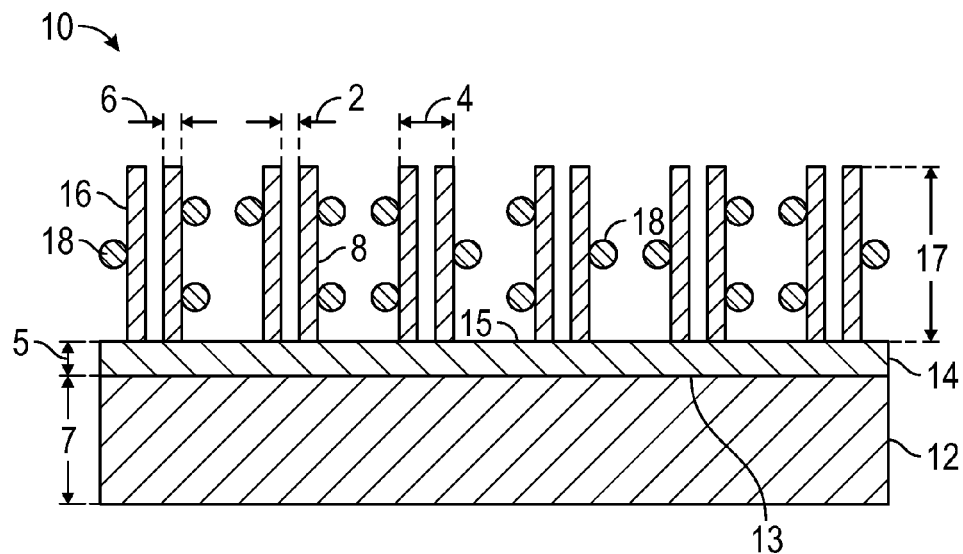
FIG. 1 illustrates generally a cross-section of a portion of a hybrid foam including $RuO_2$ nanoparticles.

FIG. 1 illustrates generally a cross-section of a portion of a hybrid foam 10 (also referred to herein as "metal oxide anchored graphene and carbon nanotube hybrid foam") including $RuO_2$ nanoparticles. In an example, the hybrid foam 10 illustrated in FIG. 1 can be used as an electrode, for example, in a supercapacitor. The hybrid foam 10 can include a porous metal substrate 12, at least one graphene layer 14, a plurality of carbon nanotubes 16, and a plurality of $RuO_2$ nanoparticles. The hybrid foam 10 can be substantially free of a binder. "Substantially" as the term is used herein means completely or almost completely; for example, the hybrid foam 10 that is "substantially free" of the binder either has none of the binder or contains such a trace amount that any relevant functional property of the hybrid foam 10 is unaffected by the presence of the trace amount.

In an example, the porous metal substrate 12 can include at least one of copper, aluminum, inconel, and nickel. In one example, the porous metal substrate 12 can be a three-dimensional porous nickel foam. The porous metal substrate 12 can have a thickness 7 within a range of about 0.5 micrometers (μm) to about 1000 μm. In one example, the thickness 7 can be about 20 μm.

The porous metal substrate 12 can include at least one graphene layer 14. As discussed herein, the at least one graphene layer 14 can be deposited onto a surface 13 of the porous metal substrate 12. In an example, the at least one graphene layer 14 can include twenty graphene layers or less. That is, hybrid foam 10 can include a number of graphene layers with a range of one graphene layer to 20 graphene layers. In an example, the at least one graphene layer 14 can include three graphene layers or less. That is, the at least one graphene layer 14 can include one graphene layer or two graphene layers. One characteristic that can affect the capacitance of the hybrid foam 10 used in, for example, a supercapacitor, is the number of graphene layers. For example, as the number of graphene layers increases, the lower the capacitance.

The hybrid foam 10 can include a plurality of carbon nanotubes 16. The plurality of carbon nanotubes 16 can be single-wall, double-wall, or multi-wall carbon nanotubes. The plurality of carbon nanotubes 16 can be grown on a surface 15 of the at least one graphene layer 14. The plurality of carbon nanotubes 16 can have an average height 17 of about 10 μm to about 10,000 μm. In an example, the average height 17 of the plurality of carbon nanotubes 16 can be about 50 μm. The average height 17 of the plurality of carbon nanotubes can affect a loading mass of active materials on the porous metal substrate 12. As discussed herein, the average height 17 of the plurality of carbon nanotubes 16 can be tailored by controlling the growth time. Where the hybrid foam 10 is to be used for supercapacitor applications, the average height 17 can be about 10 μm to about 10,000 μm. In an example, the plurality of carbon nanotubes 16 can have an average outer diameter 4 of about 8 nanometers (nm) to about 15 nm. In an example, the plurality of carbon nanotubes 16 can have an average inner diameter 2 of about 5 nm to about 50 nm and a wall thickness 6 of about 1 layer to about 50 layers. The lower the wall thickness the greater a total surface area of the hybrid foam 10, which can increase the power density of the hybrid foam 10 used in a supercapacitor application.

The hybrid foam 10 can include a plurality of $RuO_2$ nanoparticles 18 deposited onto at least one of a surface 8 of the plurality of carbon nanotubes 16 and the surface 15 of the at least one graphene layer 14. As described herein, the plurality of $RuO_2$ nanoparticles 18 can be synthesized to form hydrous $RuO_2$ nanoparticles, which can demonstrate increased capacitive ability compared to anhydrous ruthenium (IV) oxide. The increased energy density obtained by the hydrous $RuO_2$ nanoparticles can be attributed to the mixed protonic-electronic conduction. The hydrous region can allow for facile proton permeation into the bulk material while the interconnected $RuO_2$ region can allow for electronic conduction. The plurality of $RuO_2$ nanoparticles 18 can have a diameter 19 of less than 5 nm. The $RuO_2$ nanoparticles are mixed with deionized water to form a slurry. The $RuO_2$ nanoparticles can have a diameter of about 1 nm to about 2 nm. However, after the $RuO_2$ nanoparticles are deposited onto at least one of the surface 8 of the plurality of carbon nanotubes 16 and the surface 15 of the at least one graphene layer 14, the plurality of ruthenium (IV) oxide nanoparticles can agglomerate after drying and form larger particles having a diameter 19 of less than 5 nm. In an example, other $RuO_2$ nanostructures can be deposited onto the surface 8 of the plurality of carbon nanotubes 16. For example, ruthenium (IV) oxide nanowires, nanospheres, and nanoplates, can be deposited.

In an example, the hybrid foam 10 can have a loading mass within a range of about 0.0005 grams to about 0.1 grams. The loading mass can be determined by a difference between a mass of a post-loaded porous metal substrate and a mass of a pre-loaded porous metal substrate. The post-loaded porous metal substrate includes the porous metal substrate 12, the at least one graphene layer 14, the plurality of carbon nanotubes 16, and the plurality of $RuO_2$ nanoparticles 18. The pre-loaded porous metal substrate includes the porous metal substrate.

The loading mass can be adjusted by various growth conditions of the chemical vapor deposition process including time, catalyst amount, and carbon source concentration. Additionally, the loading mass can be adjusted by the surface morphology of the coating porous metal substrate, wettability of the coated porous metal substrate, and the dispersion concentration of the ruthenium (IV) oxide nanoparticles.

As discussed herein, the hybrid foam 10 can be used as an electrode, for example, in a supercapacitor. The hybrid foam 10 of the present disclosure can provide advantages over other electrodes, and in particular, over previous supercapacitors, batteries, and fuel cells. In an example, the graphene layer 14 can act as a current collector. In an example, the graphene layer 14 can act as a buffer layer that can facilitate an electrical connection between the plurality of carbon nanotubes 16 to the porous metal substrate 12.

When used in a supercapacitor application, the hybrid foam 10 can demonstrate increased gravimetric capacitance and area capacitance. The hybrid foam 10 can provide an increased surface area for the loading of the $RuO_2$ nanoarticles and can facilitate electrolyte infiltration. For example, the hybrid foam 10 can allow an electrolyte to access active materials. The plurality of carbon nanotubes 16 can act as a conductive framework such that the seamless connections at the interface between the at least one graphene layer 14 and the plurality of carbon nanotubes 16 can increase the conductivity and charge transport. Increased electrolyte access, increased conductivity, and increased charge transport can provide a high active material utilization, decreased internal resistance, increased rate handability, and increased cycling stability.

Figure 2:
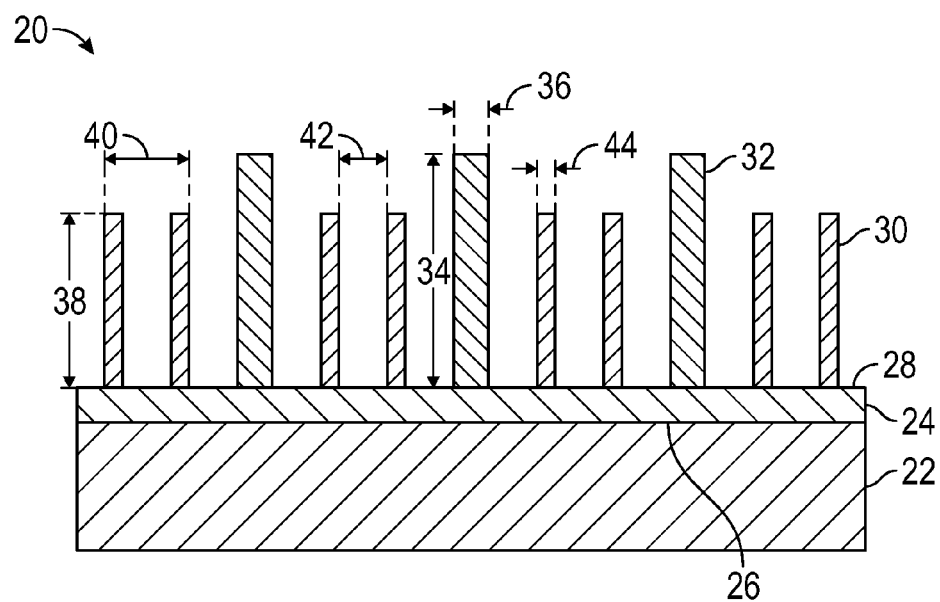
FIG. 2 illustrates generally a cross-section of a portion of a hybrid foam including $MnO^2$ nanowires.

FIG. 2 illustrates generally a cross-section of a portion of a hybrid foam 20 (also referred to herein as "metal oxide anchored graphene and carbon nanotube hybrid foam") including manganese (IV) oxide ($MnO_2$) nanowires (e.g., alpha-$MnO_2$ ($\alpha$-$MnO_2$) nanowires). In an example, the hybrid foam 20 illustrated in FIG. 2 can be used as an electrode, for example, in a supercapacitor. The hybrid foam 20 can include a porous metal substrate 22, at least one graphene layer 24, a plurality of carbon nanotubes 30, and a plurality of $MnO_2$ nanowires. The hybrid foam 20 can be substantially free of a binder.

In an example, the porous metal substrate 22 can include at least one of copper, aluminum, Inconel and nickel. In one example, the porous metal substrate 22 can be have dimensions as described herein with respect to the porous metal substrate 12, as illustrated in FIG. 1.

The porous metal substrate 22 can include at least one graphene layer 24. As discussed herein with respect to FIG. 1, the at least one graphene layer 24 can be deposited onto a surface 26 of the porous metal substrate 22. In an example, the at least one graphene layer 14 can include a number of graphene layers as described herein with respect to the at least one graphene layer 14 of FIG. 1.

The hybrid foam 20 can include a plurality of carbon nanotubes 30. The plurality of carbon nanotubes 30 can be grown on a surface 28 of the at least one graphene layer 24. The plurality of carbon nanotubes 30 can include at least one of a single-wall, double-wall, and multi-wall carbon nanotube. The plurality of carbon nanotubes 30 can have an average height 38, outer diameter 40, inner diameter, and wall thickness 44 that are described herein with respect to the plurality of carbon nanotubes 16 in FIG. 1.

In an example, the hybrid foam 20 can include a plurality of $MnO_2$ nanowires 32 deposited onto at least one of a surface of the plurality of carbon nanotubes 16 and the surface 15 of the at least one graphene layer 14. As illustrated in FIG. 2, the $MnO_2$ nanowires 32 are deposited onto a surface 28 of the at least one graphene layer 24. As described herein, the plurality of $MnO_2$ nanowires 32 can be synthesized, as described herein. The plurality of $MnO_2$ nanowires 32 can have a diameter 36 within a range of about 5 nm to about 1000 nm. In an example, the diameter 36 can be within a range of about 15 nm to about 30 nm, such as 20 nm.

FIG. 2, illustrates a plurality of $MnO_2$ nanowires 32 deposited, however, other $MnO_2$ nanostructures can be used. For example, $MnO_2$ nanoparticles, nanospheres, and nanoplates can be deposited In an example, the hybrid foam 20 can have a loading mass within a range of about 0.0005 grams to about 0.1 grams. The loading mass can be determined by a difference between a mass of a post-loaded porous metal substrate and a mass of a pre-loaded porous metal substrate. The post-loaded porous metal substrate includes the porous metal substrate 22, the at least one graphene layer 24, the plurality of carbon nanotubes 30, and the plurality of $MnO_2$ nanowires.

As discussed herein, the hybrid foam 20 can be used as an electrode, for example, in a supercapacitor. The hybrid foam 20 of the present disclosure can provide advantages over other electrodes, and in particular, over previous supercapacitors, batteries, and fuel cells.

Figure 3:
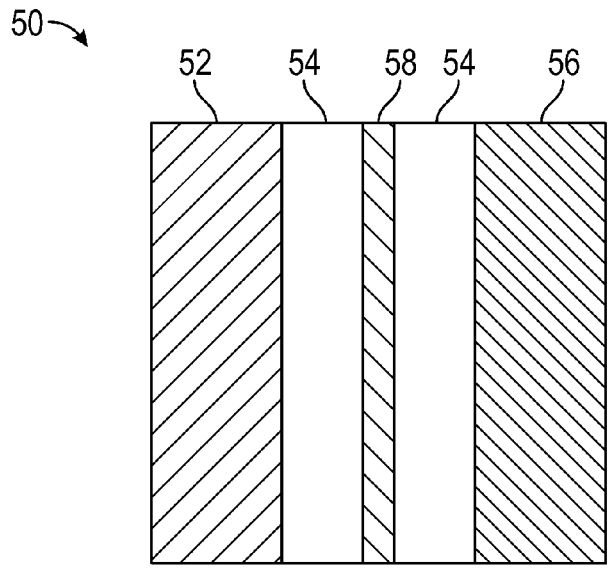
FIG. 3 illustrates generally a cross-section of a supercapacitor including a hybrid foam.

FIG. 3 illustrates generally a cross-section of a supercapacitor 50 including a hybrid foam, for example, hybrid foam 10, 20. The supercapacitor 50 can include a first electrode 52, a second electrode 56, an electrolyte 54, and a separator 58. The first electrode 52 and the second electrode 56 can be one of the hybrid foam 10, as illustrated in FIG. 1 or the hybrid foam 20, as illustrated in FIG. 2. That is, either the first and second electrodes 52, 56 are each the hybrid foam 10, as illustrated in FIG. 1 or the first and second electrodes 52, 56 are each the hybrid foam 20, as illustrated in FIG. 2.

In one example, the first electrode 52 and the second electrode 56 can include the porous metal substrate 12, the at least one graphene layer 14 deposited onto at least one of a surface 13 of the porous metal substrate 12, a plurality of carbon nanotubes 16 grown onto the surface 15 of the at least one graphene layer 14, and a plurality of $RuO_2$ nanostructures (e.g., $RuO_2$ nanoparticles 18) deposited onto at least one of a surface 15 of the at least one graphene layer 14 and the surface 8 of the plurality of carbon nanotubes 16.

In another example, the first electrode 52 and the second electrode 56 can include the porous metal substrate 22, the at least one graphene layer 24 deposited onto at least one of a surface 26 of the porous metal substrate 22, a plurality of carbon nanotubes 30 grown onto the surface 28 of the at least one graphene layer 24, and a plurality of $MnO_2$ nanostructures (e.g., $MnO_2$ nanowires 32) deposited onto at least one of a surface of the plurality of carbon nanotubes 30 and the surface 28 of the at least one graphene layer 24.

As discussed herein with respect to FIGS. 1 and 2, the porous metal substrate 12, 22 can include at least one of copper, aluminum, inconel, and nickel. In an example, the porous metal substrate 12, 22 can be a three-dimensional porous nickel foam. In an example, the at least one graphene layer 14, 24 can include twenty graphene layers or less. In an example, the at least one graphene layer 14, 24 includes three graphene layers or less. Additionally, the first electrode 22 and the second electrode 26 do not include a binder.

In an example, the electrolyte 54 can be lithium sulfate. However, other electrolytes suitable for use in a supercapacitor can be used. For example, sodium sulfate, potassium hydroxide, and potassium sulfate can be used as the electrolyte 54. The separator 58 can include a porous membrane, such as polyethylene (PE) membrane, polypropylene (PP) membrane, anodic aluminum oxide (AAO) template, block-co-polymer (BCP), and filter paper. Other porous membranes suitable for use in a supercapacitor can be used.

The supercapacitor 50 incorporating one of the hybrids foams 10, 20 can provide advantages over previous supercapacitors, batteries, and fuel cells. In an example where the supercapacitor 50 includes hybrid foam 10, the supercapcitor can be cycled reversibly in an operational voltage window of 1.5 volts (V), which is increased from previous supercapacitors operation voltage window of 1.0 V. The increased operational voltage window of a supercapacitor (including hybrid foam 10) can provide an increase in energy density, power density, and cycling stability. For example, the hybrid foam can provide a supercapacitor to have an increased capacitance, such as a specific capacitance of 502.78 farads per gram ($F\ g^{-1}$) and an area capacitance of 1.11 farads per centimeters squared ($F\ cm^{-2}$). The increased capacitance can increase the energy density. For example, they hybrid foam 10 can provide a supercapacitor with an energy density of 157.12 watt hour per kilogram ($Wh\ kg^{-1}$) and a per-area energy hybrid foam 10 can provide a supercapacitor with a power density of 512 kilowatt hour per kilogram ($kWh\ kg^{-1}$) and a per-area power density of 0.563 kilowatt hour per centimeter squared ($kWh\ cm^{-2}$). As discussed herein, the hybrid foam 10 can provide a supercapacitor with a cycling stability of about 106 percent (%) capacitance retention over 8100 cycles.

In an example where the supercapacitor 50 includes hybrid foam 20, the supercapcitor can be cycled reversibly in an operational voltage window of 1.6 V, which is increased from previous supercapacitors operation voltage window of 1.0 V. The increased operational voltage window of the supercapacitor 50 (including hybrid foam 20) can provide an increase in energy density, power density, and cycling stability. For example, the hybrid foam 20 can provide a supercapacitor with an increased capacitance, such as a specific capacitance of 1101.65 $F\ g^{-1}$. The increased capacitance can increase the energy density. In an example, the hybrid foam 20 can provide a supercapacitor with an energy density of 391.7 $Wh\ kg^{-1}$. In an example, the hybrid foam 20 can provide a supercapacitor with a power density of 799.84 $kWh\ kg^{-1}$. As discussed herein, the supercapacitor 50 incorporating hybrid foam 20 can provide a cycling stability of about 100% capacitance retention over 1300 cycles.

Figure 4:
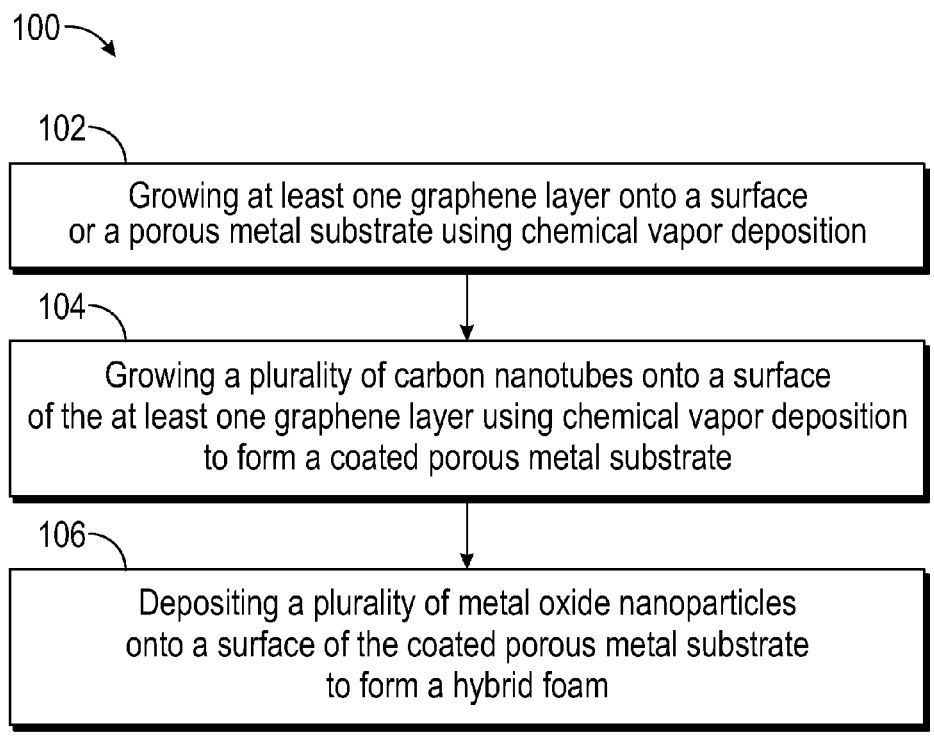
FIG. 4 illustrates generally a flow diagram of a method of forming a hybrid foam.

FIG. 4 illustrates generally a flow diagram of a method 100 for forming a hybrid foam 10. As discussed herein, the hybrid foam 10 can be formed by growing at least one graphene layer onto a surface of a porous metal substrate, growing a plurality of carbon nanotubes onto a surface the at least one graphene layer, and depositing a plurality of metal oxide nanostructures onto a surface of the coated porous metal substrate to form a hybrid foam In an example, method 100, at step 102, can include growing at least one graphene layer onto a surface of a porous metal substrate using chemical vapor deposition. For example, the at least one graphene layer 14 can be grown onto the surface 13 of the porous metal substrate 12, as shown in FIG. 1. In an example, the method 100 can include forming less than three graphene layers onto the surface of the conductive substrate. In an example, twenty graphene layers or less can be formed onto the surface of the porous metal substrate.

In an example, method 100, at step 104, can include growing a plurality of carbon nanotubes onto the surface of the porous metal substrate using chemical vapor deposition to form a coated porous metal substrate. "Coated porous metal substrate" as the term is used herein means a porous metal substrate having at least one graphene layer and a plurality of carbon nanotubes. For example, the plurality of carbon nanotubes 16 can be grown onto the surface 15 of the at least one graphene layer 14.

In an example, growing the at least one graphene layer and the plurality of carbon nanotubes can be done simultaneously via chemical vapor deposition. For example, the porous metal substrate can be positioned within a chamber where the chamber has ambient pressure and an atmosphere of argon and hydrogen gas. In an example, the method 100 can include applying a reactive ion etching plasma to the porous metal surface to clean the surface. In an example, the method 100 can include depositing catalyst particles onto the surface of the porous metal surface. In an example, the catalyst particles can be chosen from iron (Fe), nickel (Ni), cobalt (Co), and silicon (Si). In one example, the catalyst particles include a plurality of iron particles. The catalyst particles can have an average diameter within a range of about 1 nm to about 5 nm. The method 100 can include depositing the catalyst particles via electron bean evaporation. The method 100 can include selectively patterning the catalyst particles onto the surface of the porous metal substrate. The method 100 can include heating the porous metal substrate including the catalyst particles to a temperature within a range of about 500 degrees Celsius (° C.) to about 900° C. After heating the porous metal substrate, a mixture of hydrocarbon (ethylene ($C_2H_4$)/acetylene ($C_2H_2$)) and hydrogen ($H_2$) can be introduced into the chamber to simultaneously grow the at least one graphene layer and the plurality of carbon nanotubes. In an example, other hydrocarbon mixtures can be used. For example, a mixture including a combination of acetylene, ethylene, methane and hydrogen can be used.

In an example, the method 100, at step 106 can include depositing a plurality of metal oxide nanostructures onto a surface of the coated porous metal substrate to form a hybrid foam. For example, the plurality of metal oxide nanostructures can be deposited onto at least one of the surface of the plurality of carbon nanotubes and the surface of the at least one graphene layer. In an example, depositing the plurality of metal oxide nanostructures can include submerging (e.g., dip-coating) the coated porous metal substrate into a solution including the plurality of metal oxide nanostructures and deionized water or ethanol. In an example, the plurality of metal oxide nanostructures can be chosen from a plurality of $RuO_2$ nanoparticles and a plurality of $MnO_2$ nanowires. As discussed herein, other nanostructures of $RuO_2$ and $MnO_2$ can also be used.

In an example, prior to submerging the coated porous metal substrate into the solution, the method 100 can include treating the coated porous metal substrate with ultraviolet-generated ozone for a time period, for example, 60 seconds. Treating the coated porous metal substrate with the ultraviolet-generated ozone can improve the wetting of the surface of the coated porous metal substrate.

In an example, the method 100 can include drying the hybrid foam at a first temperature for a first time period, and annealing the hybrid foam at a second temperature for a second time period. For example, the hybrid foam can be dried at 110° C. for 2 hours and the hybrid foam can be annealed at 150° C. for 6 hours. Other temperatures and time periods can be used for drying and annealing. The annealing can enlarge the grain size and release the residue stress in the foam.

EXAMPLES

The following examples are given to illustrate, but not limit, the scope of the present disclosure.

Hybrid Foam Including Ruthentium (IV) Nanoparticles
Forming Hydrous Ruthenium (IV) Oxide Particles Sodium hydroxide solution (1 molar (M)) is slowly injected into 100 ml of ruthenium (III) chloride (0.1 M; available from Sigma Aldrich, USA) by a micro fluid system at a rate of 0.5 centimeters cubed per minute ($cm^3 min^{-1}$) (0.5 millimeter per min) to form a mixed solution and to balance the pH to 7. The chemical reaction is as follows: $RuCl_3+3NaOH=Ru(OH)_3+3NaCl$. The mixed solution was stirred for 12 hours. After stirring, the mixed solution is centrifuged and washed with deionized water several times to remove unwanted residue slats (sodium chloride). The $RuO_2$ nanoparticles are dried at 120° C. for 12 hours. The $RuO_2$ nanoparticles are dispersed in deionized water to form a slurry. An ultrasonic treatment was applied to the slurry to form a uniform gel-like suspension (about 5 miligrams per milileter ($mg\ ml^{-1}$)) and the resulting suspension was continuously stirred.

Figure 8:
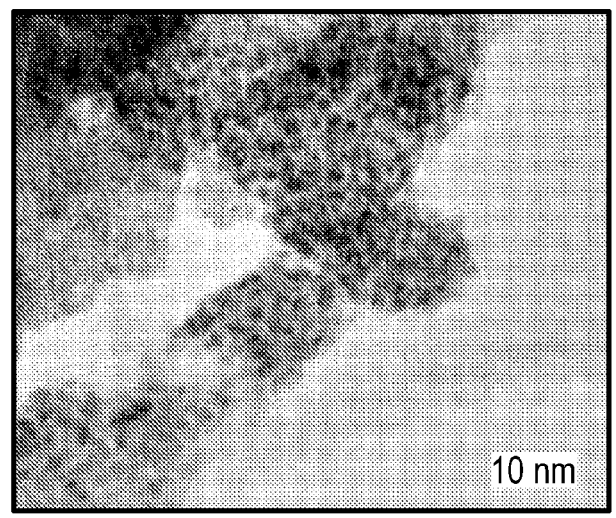
FIG. 8 illustrates as-prepared hydrous $RuO_2$ nanoparticles.
Figure 9:
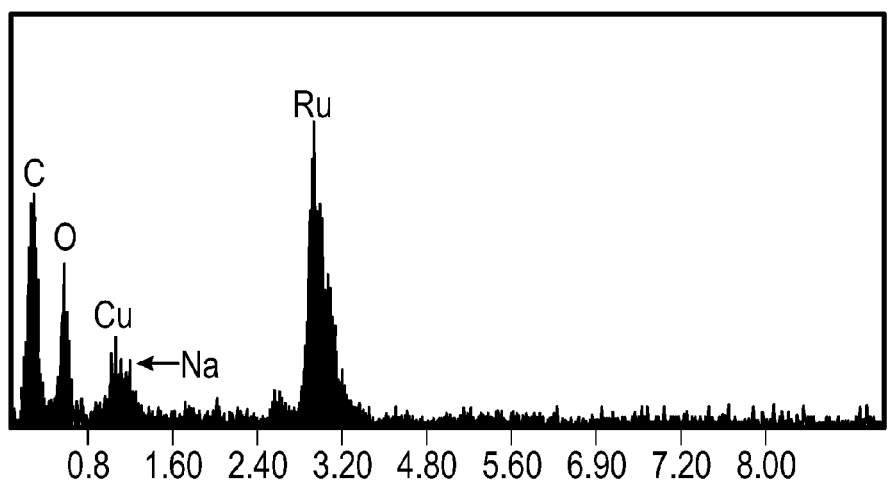
FIG. 9 illustrates an energy-dispersive X-ray spectroscopy (EDS) of the $RuO_2$ nanoparticles.

Referring to FIG. 8. FIG. 8 illustrates the $RuO_2$ nanoparticles. As illustrated, the $RuO_2$ particles have a crystalline size around 1-2 nm. FIG. 9 illustrates an energy-dispersive X-ray spectroscopy (EDS) of the $RuO_2$ nanoparticles. The EDS illustrates the presence of the main components ruthenium (Ru) and oxygen (O), along with minor amounts of sodium (Na) from the reaction precursor. The copper (Cu) and Calcium (C) peaks are background from the transmission electron microscopy (TEM) support grid.

Forming Ruthenium Oxide Anchored Graphene and Carbon Nanotube Hybrid Foam ("Hybrid Foam")

Reactive ion etching plasma is applied to a surface of a three-dimensional nickel foam (e.g., porous metal substrate) having a thickness of 0.5 milimeters (mm) A thin layer of iron particles (e.g., catalyst particles) is deposited onto the surface of the three-dimensional nickel foam by electron beam evaporation. At least one graphene layer and a plurality of carbon nanotubes are formed on the surface of the porous metal substrate to form a coated porous metal substrate. The at least one graphene layer and the plurality of carbon nanotubes are grown by chemical vapor deposition at 750 degrees Celsius using a mixture of hydrocarbon (ethylene ($C_2H_4$)/acetylene ($C_2H_2$)) and hydrogen ($H_2$). The coated porous metal substrate is submerged into the slurry including the hydrous $RuO_2$ nanoparticles and deionized water to deposit the $RuO_2$ nanoparticles onto a surface of the plurality of carbon nanotubes to form a hybrid foam. The $RuO_2$ nanoparticles and the coated porous metal substrate exhibit intimate interfaces due to the abundance of hydrophilic groups on their surface. After the ruthenium (IV) oxide nanoparticles are deposited, the hybrid foam is dried at 110° C. for 1 hour and annealed at 150° C. for 6 hours under vacuum.

Figure 5:
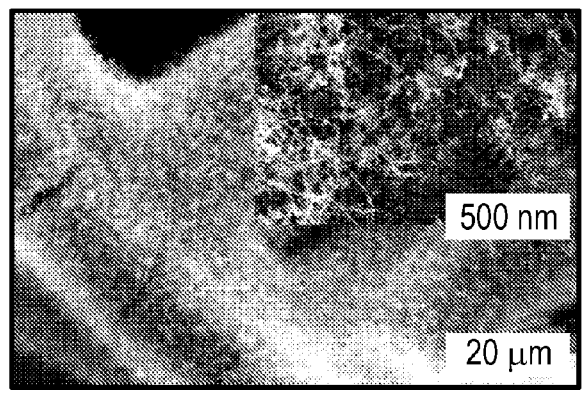
FIG. 5 illustrates a scanning electron microscope (SEM) image of a coated porous metal substrate.
Figure 6:
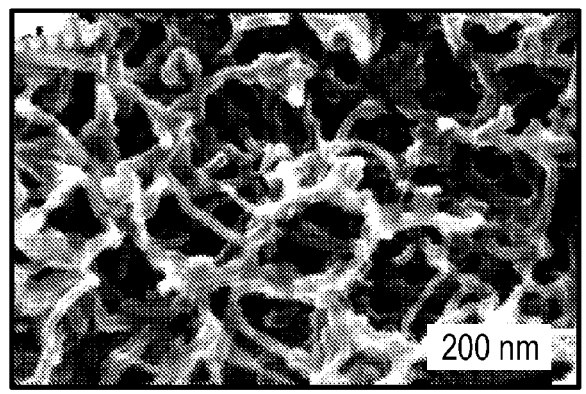
FIG. 6 illustrates a SEM image of a hybrid foam including $RuO_2$ nanoparticles.
Figure 7:
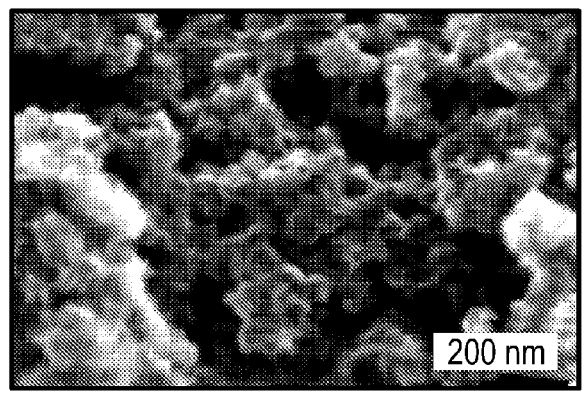
FIG. 7 illustrates a SEM image of a hybrid foam including $RuO_2$ nanoparticles.

FIG. 5 illustrates a SEM image of a coated porous metal substrate. That is, a three-dimensional nickel foam including at least one graphene layer and a plurality of carbon nanotubes. FIGS. 6 and 7 illustrate SEM images of hybrid foams having different loading masses. For example, the hybrid foam in FIG. 6 has a loading mass less than a loading mass of the hybrid foam in FIG. 7.

Example 1

Forming the Supercapacitor Including the Hybrid Foam Having Ruthenium (IV) Oxide Nanoparticles Two symmetrical rectangular hybrid foams including $RuO_2$ nanoparticles were fabricated as described herein. The two hybrid foams were spaced apart by a porous separator (Celgard 3501; available from Celgard). Lithium sulfate (2 molar) was used as the electrolyte.

Comparative Example 1

Comparative Example 1 is prepared by mixing $RuO_2$ particles with 2 weight percent polyvinylidene fluoride (PVDF) binder in N-Methyl-2-Pyrrolidone (NMP) as the solvent.

Comparative Example 2

Comparative Example 2 is prepared by growing at least one graphene layer and a plurality of carbon nanotubes onto a three-dimensional nickel foam without including the $RuO_2$ particles.

Cyclic Voltammetry (CV) Measurements of Example 1

Cyclic voltammetry (CV) measurements of Example 1 were conducted at scanning grates between 10 millivolts per second (mV sec$^{-1}$) and 200 mV sec$^{-1}$ in lithium sulfate (2 M) to estimate the capacitance and determine the useable voltage window.

Figure 10:
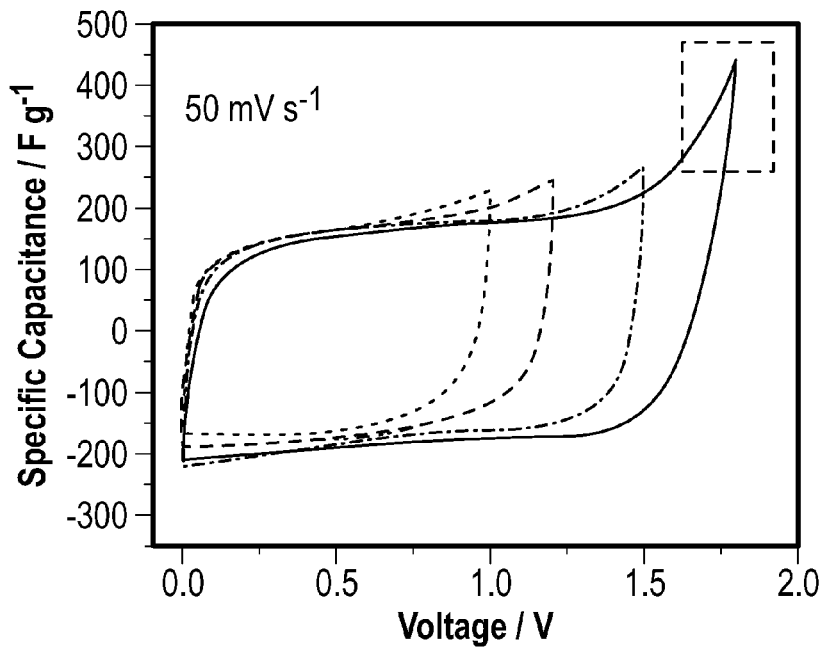
FIG. 10 illustrates a cyclic voltammetry plot for Example 1.

FIG. 10 illustrates a cyclic voltammetry plot for Example 1 over different potential windows with a scan rate of 50 mV sec$^{-1}$. As shown in FIG. 10, with the increasing of potential limits from 1.0 to 1.8 V, more RuO$_2$ nanoparticles are involved in the surface-redox process. When the voltage window is increased beyond 1.8 V, an increasing amount of irreversible charge is observed which suggests the decomposition of aqueous electrolyte with hydrogen or oxygen evolution. However, as shown in FIG. 10, no significant increase of anodic current is revealed at or below 1.5 V. Thus, the supercapacitor of Example 1 can provide an operational voltage window of 1.5 V which is greater than a majority of the aqueous electrolyte supercapcitors having an operational voltage window of 1.0 V, which are thermodynamically limited to an operational voltage window of 1.0 V due to the decomposition of water at 1.23 V. Not to be bound by theory, the increase in the operational voltage window is believed to be partially attributed to the enhanced electrochemical stability of the hybrid foam.

Figure 11:
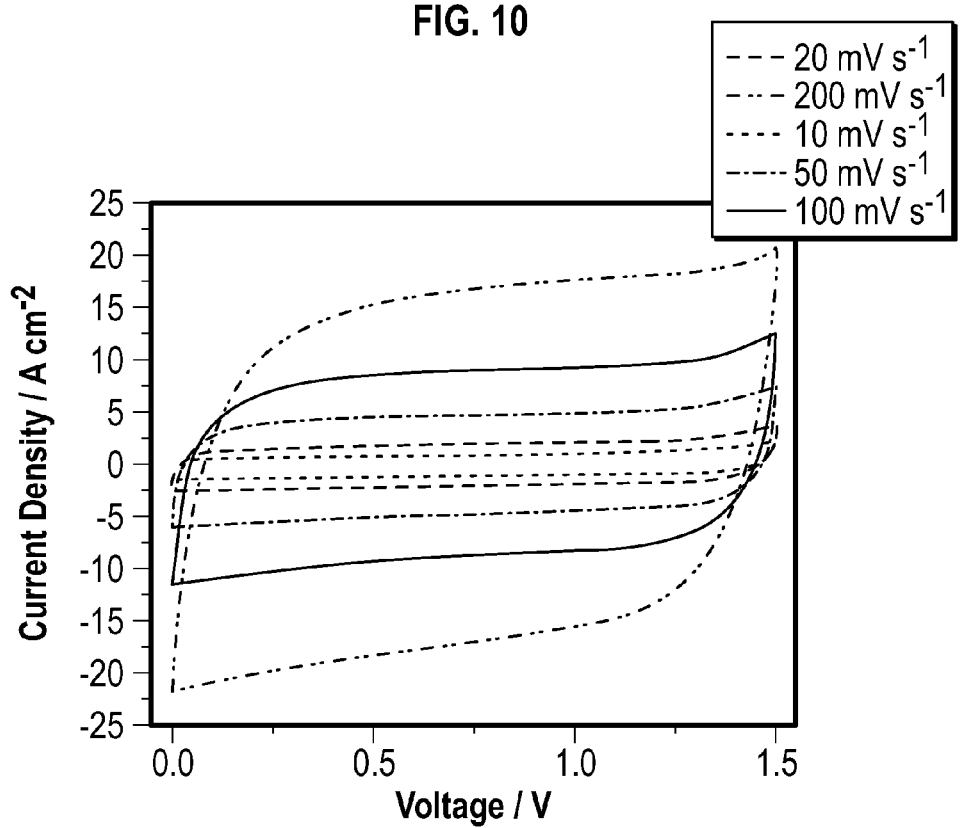
FIG. 11 illustrates a cyclic voltammetry plot for Example 1.

FIG. 11 illustrates a cyclic voltammetry plot for Example 1. The cyclic voltammetry plot is scanning rates of 10 mV sec$^{-1}$, 20 mV sec$^{-1}$, 50 mV sec$^{-1}$, 100 mV sec$^{-1}$. FIG. 11 illustrates near rectangular CV characteristics of Example 1 with an operational voltage window of 1.5 V. The nearly rectangular shape and the absence of oxidation and reduction peaks are observed for all scan rates suggesting that the supercapacitor of Example 1 can have small equivalent series resistance, high rate handling ability, and excellent electrochemical performance. Moreover, the nearly mirror-image shape of the CV curves indicates exceptional reversibility a fast surface reaction. The nearly identical specific capacitance characteristics for all scan rates further indicated process stability, repeatability, and increased performance of the supercapacitor of Example 1.

Chronopotentiometry (Charge-Discharge) Measurements of Example 1

Figure 12:
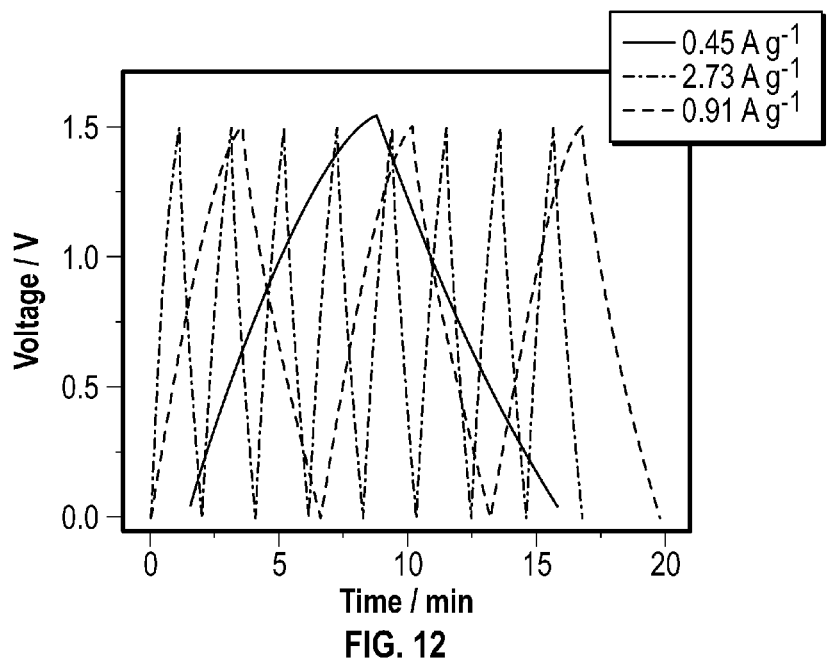
FIG. 12 illustrates the charge-discharge characteristics of Example 1.

Chronopotentiometry measurements were conducted with an operational window of 1.5 V to further evaluate the electrochemical performance of the supercapacitor of Example 1. FIG. 12 illustrates the charge-discharge characteristics of Example 1 with different current densities. The near linear and symmetric charge and discharge curves suggest an excellent capacitive performance with a rapid current-voltage response (I-V) response for Example 1.

Specific Capacitance of Example 1

Figure 13:
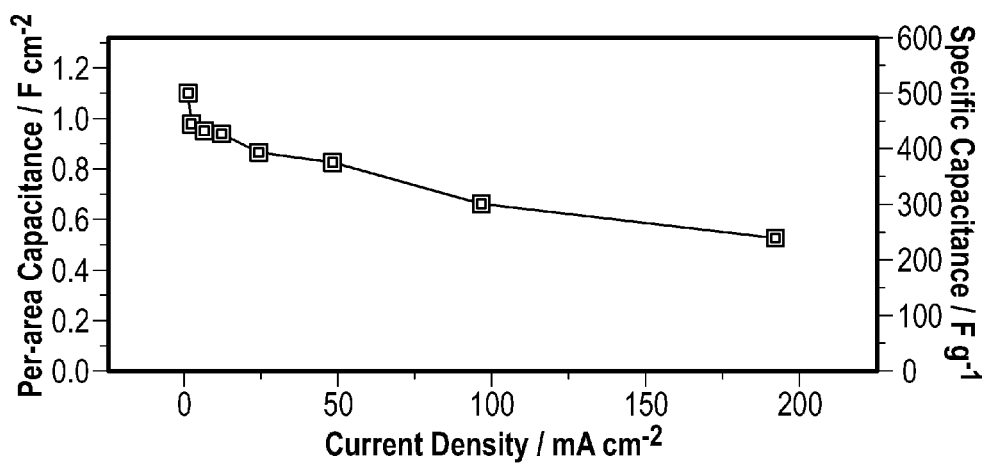
FIG. 13 illustrates specific capacitance and per-area capacitance of Example 1.

Specific capacitance (C$_s$) values were calculated from the charge-discharge curves in FIG. 12 via equation (1) C$_s$=2i/m(dv/dt), where m is the carbon mass of one electrode (e.g., hybrid foam), i is the discharge current and dV/dt is the slope of the discharge curve. FIG. 13 illustrates the specific capacitance and per-area capacitance of Example 1 under different current densities below 200 milliampes per centimeter squared (mA cm$^{-2}$). The highest gravimetric capacitance of 502.78 F g$^{-1}$ and area capacitance of 1.11 F cm$^{-2}$ were obtained at the same time under a current density of 1 mA cm$^{-2}$.

Cyclic Stability of Example 1 and Comparative Example 1

Figure 14:
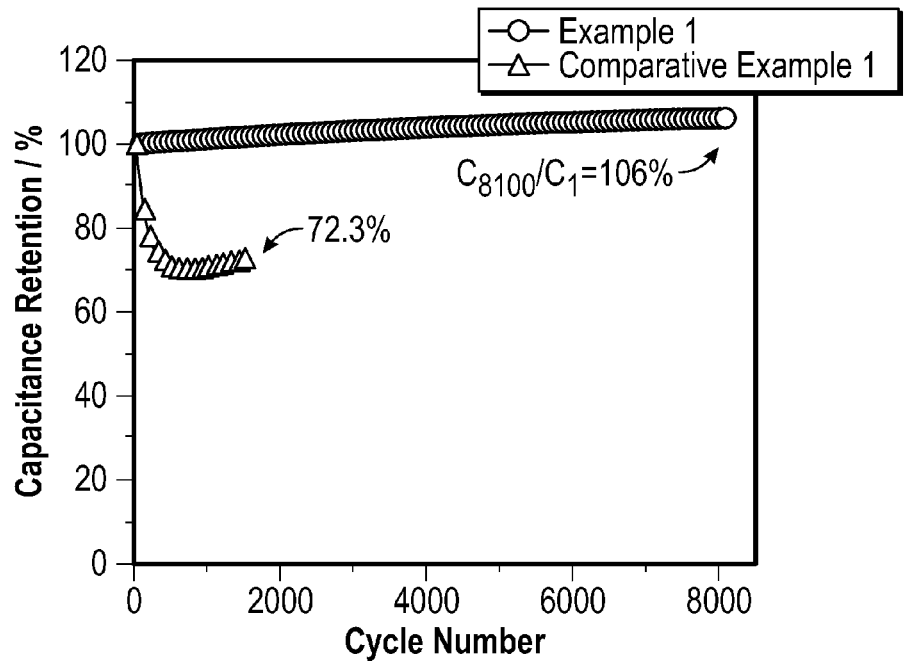
FIG. 14 illustrates cyclic stability of Example 1 and Comparative Example 1.

A sequence of charge-discharge cycles for Example 1 (Voltage window 1.5 V) and Comparative Example 1 (Voltage window 1.0 V) under current density of 96 mA cm$^{-2}$ were conducted. FIG. 14 illustrates the cyclic stability of Example 1 and Comparative Example 1. As shown in FIG. 14, after 8100 cycles, Example 1 maintained relatively constant capacitance retention. The capacitance retention of Example 1 actually slightly increased to about 106 percent. Not to be bound by theory, the slight increase in capacitance observed is believed to be partially attributed to the electrochemical activation of the active materials during cycling. Additionally, the slight increase in capacitance can also be attributed to the increased interfacial area between the hybrid foam and the electrolyte with an increase in reaction time. This self-strengthening effect can also assist to stabilize the supercapacitor in long term operation (e.g., greater than 1000 cycles). In contrast to Example 1, Comparative Example 1 had a decrease in capacitance to about 72.3 percent.

Potentiostatic Electrochemical Impedance Spectroscopy Measurements of Example 1

Potentiostatic electrochemical impedance spectroscopy (EIS) measurements were performed on Example 1 to further characterize the performance of the supercapacitor of Example 1.

Figure 16:
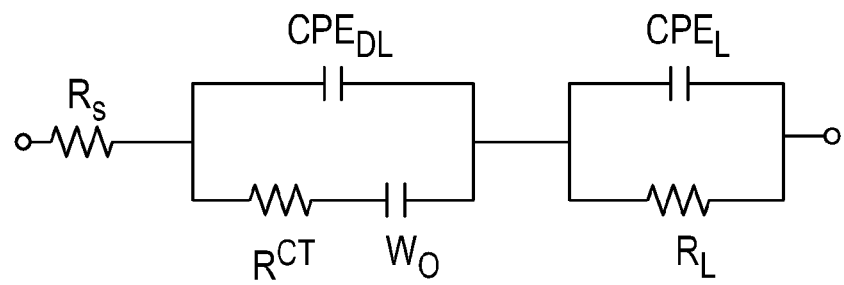
FIG. 16 illustrates an equivalent circuit used for fitting of the EIS plots.

The equivalent circuit of Randle's model used for fitting of the EIS plots is shown in FIG. 16. As illustrated in FIG. 16, R$_S$ is the equivalent series resistance (ESR), R$^{CT}$ is the resistance of the electrode-electrolyte (e.g., hybrid foam-electrolyte), R$_L$ is the leakage resistance, CPE$_{DL}$ is the constant phase element (CPE) of double layer, W$_O$ is the Warburg element, and CPE$_L$ is the mass capacitance. The fitted data for all circuit elements are shown in Table I.

TABLE I

| Example 1 | R$_S$ | R$^{CT}$ | CPE$_{DL}$ | W$_O$ | CPE$_L$ | R$_L$ |
|---|---|---|---|---|---|---|
| 1$^{st}$ Cycle | 1.7 Ω | 1.02 Ω | Q$_{DL}$ = 0.00095 n$_{DL}$ = 0.635 | W$_{OR}$ = 2.5 W$_{OC}$ = 0.42 | Q$_L$ = 0.16 n$_L$ = 0.75 | 2000 Ω |
| 8100$^{th}$ Cycle | 1.524 Ω | 0.195 Ω | Q$_{DL}$ = 0.011 n$_{DL}$ = 0.65 | W$_{OR}$ = 3 W$_{OC}$ = 0.5 | Q$_L$ = 0.13 n$_L$ = 0.83 | 2000 Ω |

Figure 15:
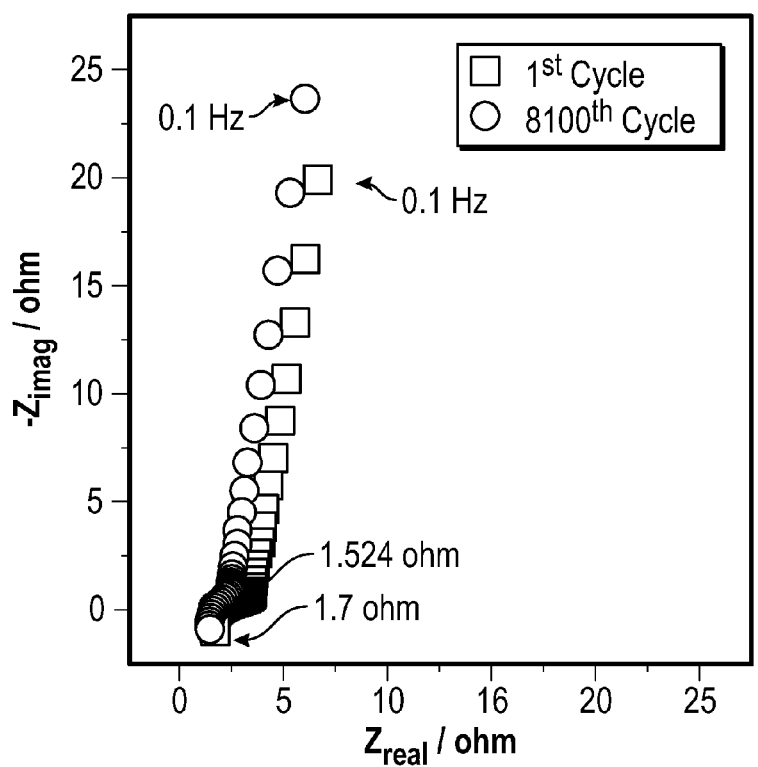
FIG. 15 illustrates potentiostatic electrochemical impedance spectroscopy (EIS) measurements for Example 1.

FIG. 15 is a graph illustrating potentiostatic electrochemical impedance spectroscopy measurements for Example 1. The equivalent circuit used for fitting of the EIS plots is shown in FIG. 16. As illustrated in FIG. 15, the first cycle and the 8100$^{th}$ cycle each show near linear and vertical characteristics. Some deviation from absolute ideality is evident, but this can be a result of frequency dispersion due to wider distribution of the pore size of the porous matrix. Both spectra possess a low ESR of about 1.5 ohms (Ω), which further demonstrates an electrochemical cycling stability of Example 1. The decreased ESR from 1.7Ω to 1.52Ω after 8100 cycles may correspond to a reduction in internal resistance of the electrodes due to the electrochemical activation of active materials during cycling.

Charge transfer resistance (R$_{CT}$) characterizes the rate of redox reductions at the electrode-electrolyte interface (e.g., hybrid foam-electrolyte interface). The charge transfer resistance can dictate the speed of ion transport through the electrode-electrolyte interface. Another factor that can attribute to the increased cycling performance is the at least one graphene layer facilitating charge transfer between the ruthenium (IV) oxide/carbon nanotube network layer and the current collector (e.g., the porous metal substrate). Additionally, the relatively small charge transfer resistance can be associated with increased contact area at the electrode-electrolyte interface. Thus, ion transfer and charge transfer can be improved. The constant phase element (CPE) representing double layer, which occurs at interfaces between solids and ionic solutions due to separation of ionic and/or electronic charges. As shown in Table I, the $CPE_{DL}$ increases with cycling. This is due to activation of more material and the corresponding increase in surface area available as the supercapacitor was cycled repeatedly. This is also supported by the drop in charge transfer resistance after 8100 cycles The double layer capacitance increased by about 1000 percent, while the charge transfer resistance decreased by about 80 percent after cycling 8100 times. The Warburg element ($W_O$) represents the diffusion of ions into the porous electrode during the intermediate frequency region. The slope of the Warburg region dictates electric double layer forming speed. Leakage resistance ($R_L$) is placed in parallel with $CPE_L$. $CPE_L$ denotes pseudocapacitance, which arises with voltage dependent Faradaic charge transfer processes. No signification change in pseudocapacitance is observed for Example 1 before and after cycling.

Figure 17:
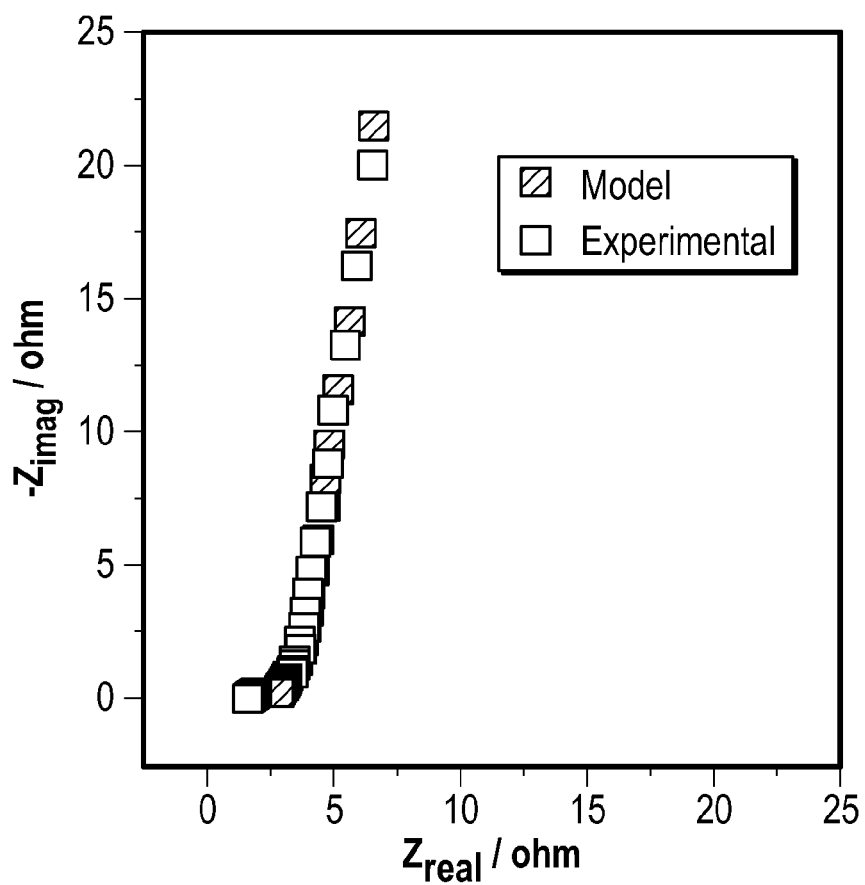
FIG. 17 illustrates experimental and model EIS measurements for Example 1 after the first cycle.
Figure 18:
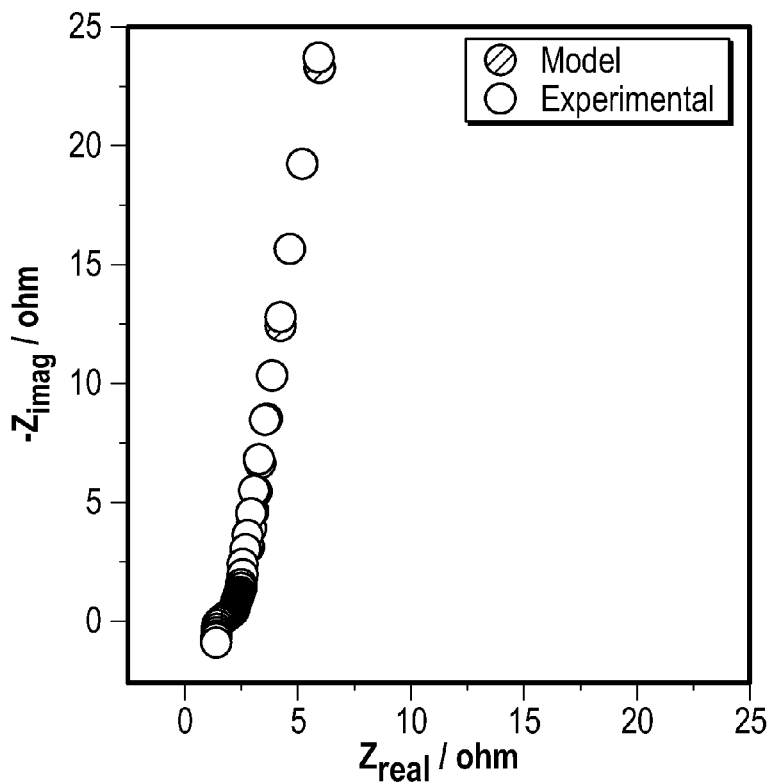
FIG. 18 illustrates experimental and model EIS measurements for Example 1 after the $8100^{th}$ cycle.

FIG. 17 illustrates experimental and model EIS measurements for Example 1 after the first cycle. The experimental EIS measurements are the measured electrochemical impedance spectra and the model EIS measurements are achieved by fitting the equivalent circuit. FIG. 18 illustrates experimental and model EIS measurements for Example 1 after the $8100^{th}$ cycle.

As discussed herein, the equivalent circuit of Randle's model is shown in FIG. 16. FIG. 17 shows the experimental and modeled Nyquist plots for complex impedance for RGM after $1^{st}$ cycle. FIG. 18 shows the experimental and modeled Nyquist plots for complex impedance for RGM after $1^{st}$ cycle $8100^{th}$ cycle.

Figure 19:
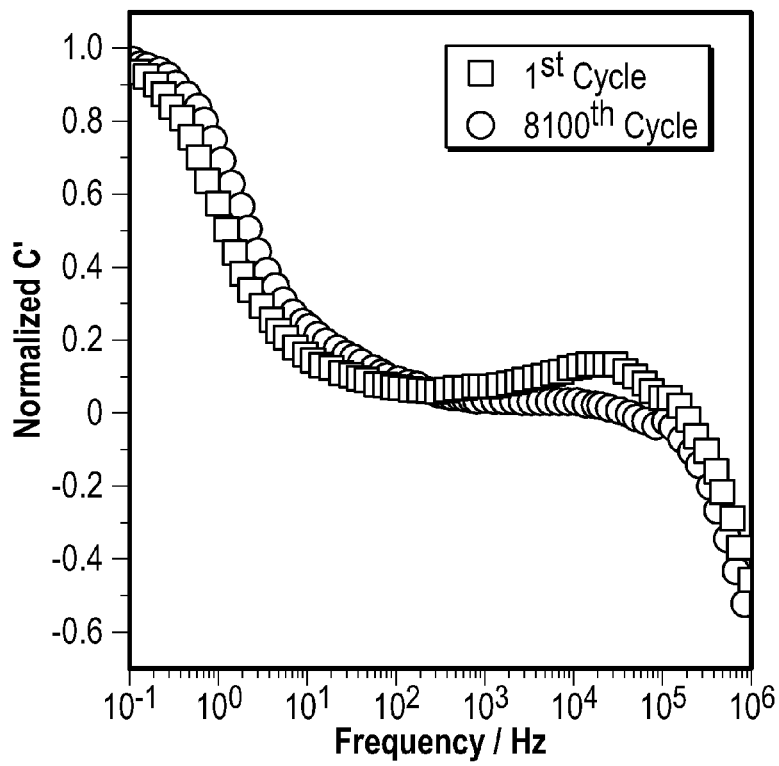
FIG. 19 illustrates normalized real capacitance and imaginary capacitance against frequency for Example 1 at the first cycle and after 8100 cycles.
Figure 20:
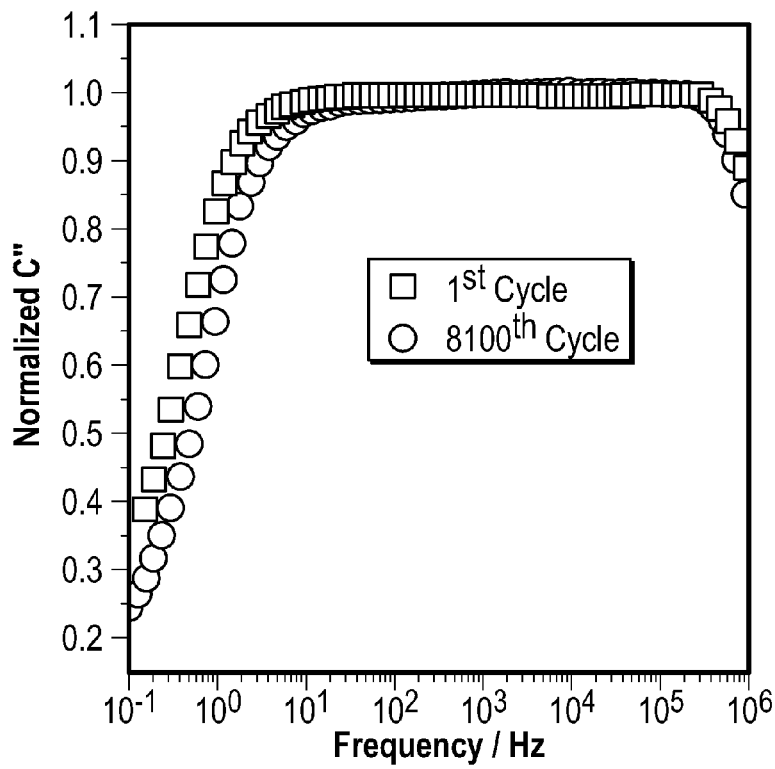
FIG. 20 illustrates normalized real capacitance and imaginary capacitance against frequency for Example 1 at the first cycle and after 8100 cycles.

FIG. 19 illustrates normalized real capacitance against frequency for Example 1 at the first cycle and after 8100 cycles. FIG. 20 illustrates normalized imaginary capacitance against frequency for Example 1 at the first cycle and after 8100 cycles. It can be observed that for Example 1, after 8100 cycles, shows a higher capacitive and less resistive behavior than Example 1 at the first cycle. Example 1, after 8100 cycles, shows a faster dielectric relaxation time characteristic than that in the first cycle. Therefore, ion diffusion is further facilitated with increasing cycling numbers for Example 1.

Figure 21:
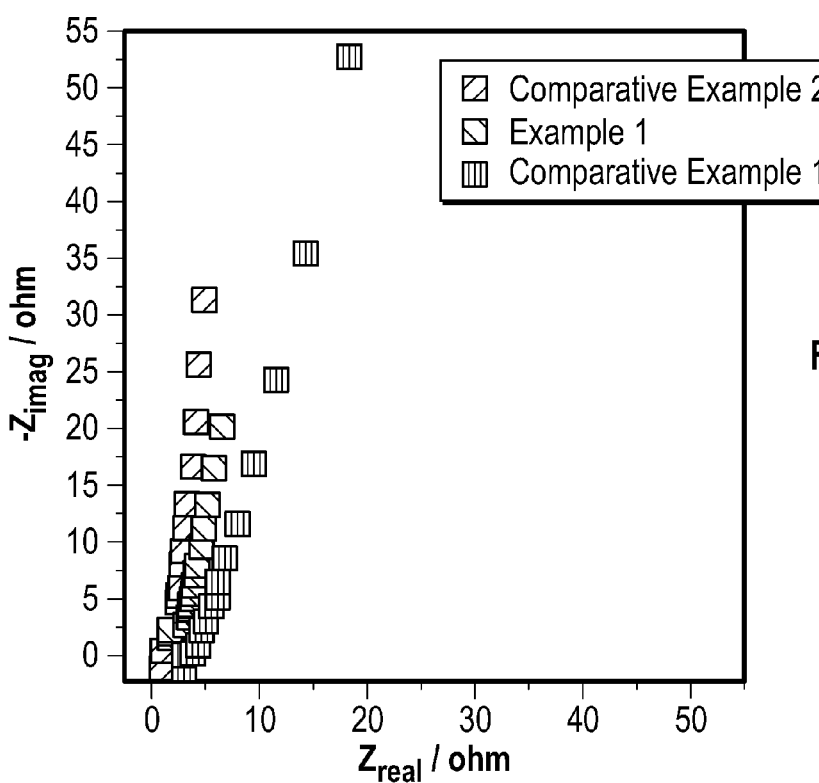
FIG. 21 illustrates EIS plot for Example 1, Comparative Example 1, and Comparative Example 2.
Figure 22:
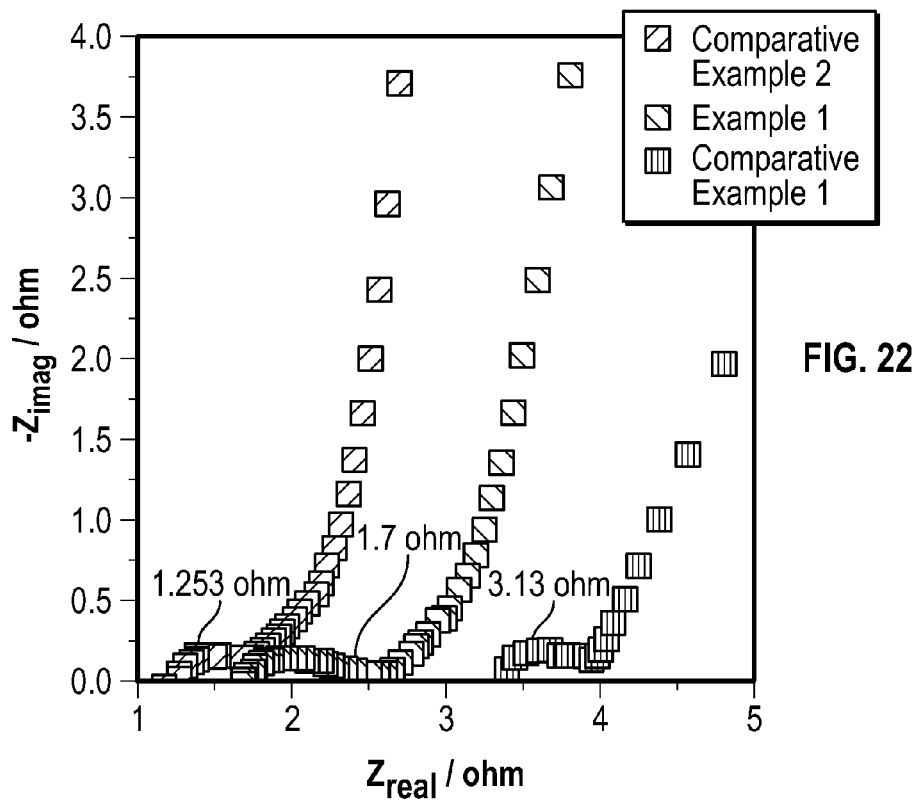
FIG. 22 illustrates high frequency region EIS plot for Example 1, Comparative Example 1, and Comparative Example 2.

FIG. 21 illustrates and EIS plot for Example 1, Comparative Example 1, and Comparative Example 2. FIG. 22 illustrates high frequency region EIS plots for Example 1, Comparative Example 1, and Comparative Example 2. As shown in FIG. 22, introducing the $RuO_2$ nanoparticles (Example 1) introduced a light increase of ESR from 1.253 Ω to 1.7Ω. Compared to the Comparative Example 2 (ESR of 3.13Ω), a much lower ESR is achieved with Example 1 (1.7Ω). Approximately about a 45% decrease.

Ragon Plot of Example 1

Figure 23:
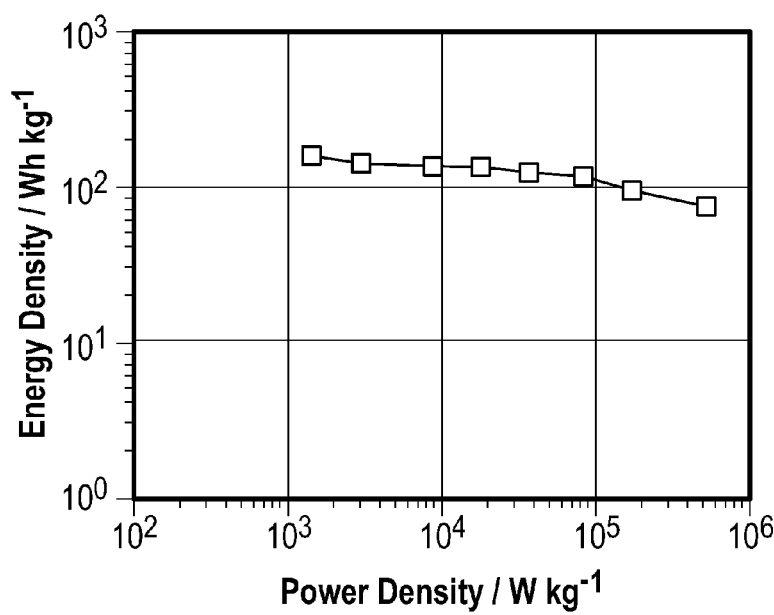
FIG. 23 illustrates a Ragon plot related to energy densities and power densities of Example 1.

FIG. 23 illustrates a Ragon plot related to energy densities and power densities of Example 1.

As discussed herein, the method disclosed herein can provide a binder-free technique for forming hybrid nanostructures that can be used in lithium ion batteries. The hybrid nanostructure of the present disclosure can have a reversible capacity of 900 mAh $g^{-1}$, which is higher than other graphitic systems including vertically aligned carbon nanotubes. The hybrid nanostructure of the present disclosure illustrated a high cycling stability. For example, the hybrid nanostructure exhibited about 99% capacity retention with about 100% Coulombic efficiency over 250 cycles, while the hybrid nanostructure maintains the porous network nature after the charge-discharge cycles.

Summary

In summary, a hybrid foam has been demonstrated, which was prepared by ambient pressure chemical vapor deposition of graphene/carbon nanotube foam structure and simple bath deposition of $RuO_2$ nanoparticles. This method of preparing electrodes offers a facile, scalable and a low-cost approach for high energy density supercapacitor applications. The two-step process successfully renders the conformal coating of $RuO_2$ nanoparticles on the graphene/carbon nanotube backbone to form an intertwined network between carbon nanotubes and $RuO_2$ nanoparticles. Such integration of metal oxide nanostructures with the graphene/carbon nanotube foam structure resulted in superior gravimetric and per-area capacitive performance (specific capacitance of 502.78 F $g^{-1}$ and an area capacitance of 1.11 F $cm^{-2}$) at the same time. The increased capacitance and expanded operational voltage window of 1.5 V can increase the energy density to 157.12 Wh $kg^{-1}$ (per-area energy density of 0.173 Wh $cm^{-2}$) and the power density of 512 kWh $kg^{-1}$ (per-area power density of 0.563 kWh $cm^{-2}$). Further, the hybrid foam can provide a cycling stability of about 106% capacitance retention over 8100 cycles. The electrochemical stability, capacitive performance, and the easiness of preparation illustrates the hybrid foam can be advantageous over previous supercapacitors.

Hybrid Foam Including Manganese (IV) Nanowires

Forming Manganese (IV) Oxide Particles

Potassium permanganate ($KMnO_4$; 10 ml; 0.20M) was mixed with manganese (II) sulfate ($MnSO_4$; 10 ml; 0.10M) using magnetic stirring for 10 minutes to form a solution. Then the solution was transferred to 40 ml Teflon-lined autoclave and heated to 160 degrees Celsius. A product solution including alpha-manganese (IV) oxide ($\alpha$-$MnO_2$) nanotubes (also referred to herein as "$MnO_2$") was obtained. These $MnO_2$ nanowires were washed several times by deionized water and pure ethanol to remove inorganic ions and other impurities. The chemical reaction is as follows:

$$3MnSO_4 + 2KMnO_4 + 2H_2O = 5MnO_2 + K_2SO_4 + 2H_2SO_4$$

X-ray Diffraction (XRD) Measurements of the Manganese (IV) Oxide Nanowires

Figure 28:
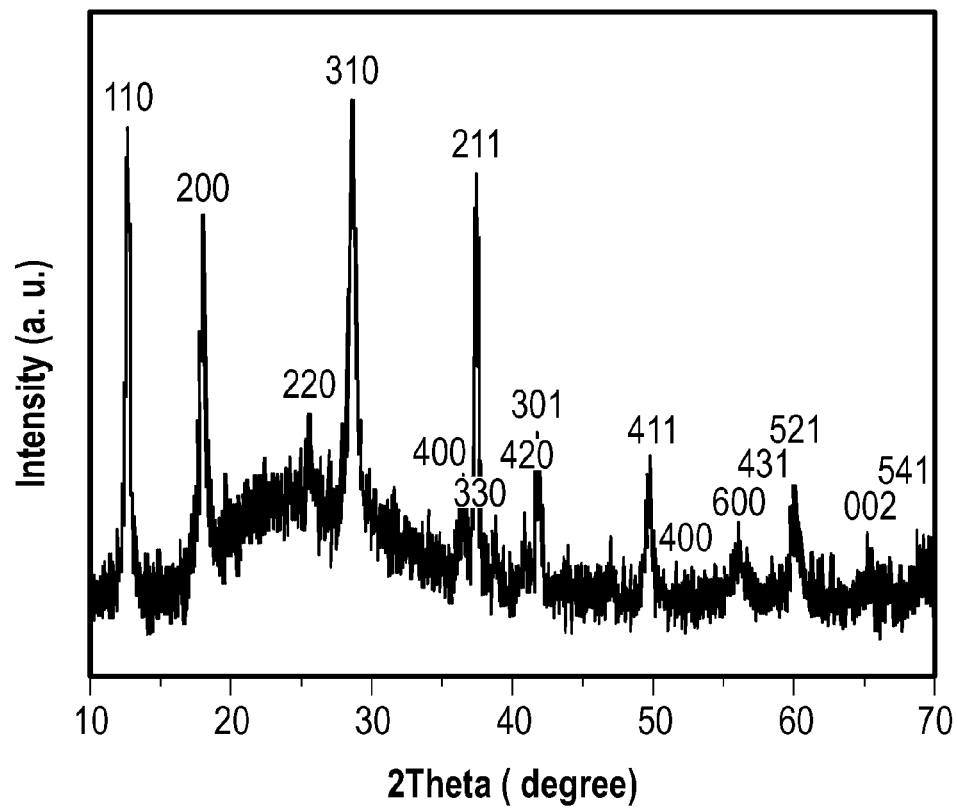
FIG. 28 illustrates the X-ray diffraction (XRD) pattern of alpha-$MnO_2$ nanowires.

XRD measurements are performed to confirm the phase and purity of the $MnO_2$ nanowires. Referring to FIG. 28, FIG. 28 illustrates the XRD pattern of $MnO_2$ nanowires. The XRD pattern can be indexed as $\alpha$-$MnO_2$ (space group: I4/m (87)) with lattice constants of a=9.7847 Å and c=2.8630 Å or cryptomelane ($K_{0.33}Mn_2O_4$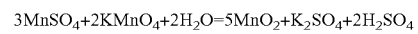), which is isostructural with $\alpha$-$MnO_2$.

Figure 29:
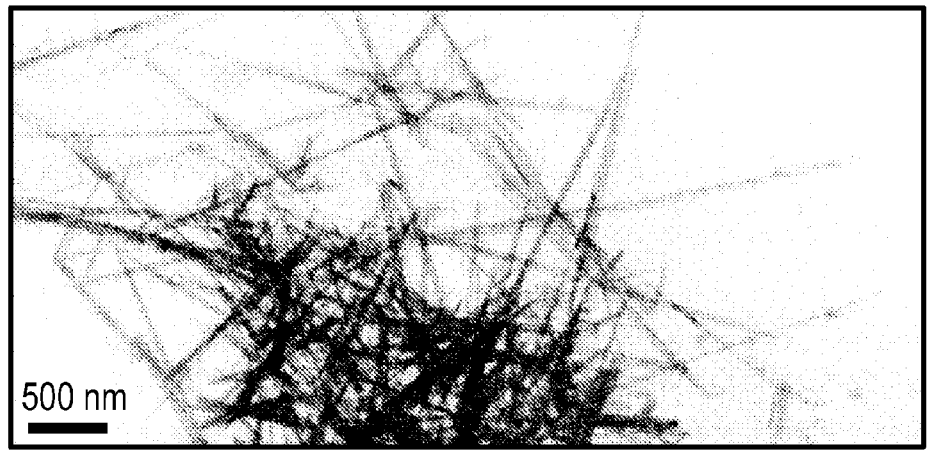
FIG. 29 illustrates a transmission electron microscopy (TEM) image of the $MnO_2$ nanowires.

Transmission Electron Microscope Images of the as-Prepared Alpha-Manganese (IV) Oxide Nanowires The structure and composition of the $MnO_2$ nanowires are further examined in a CM300 transmission electron microscope (TEM) at an accelerating voltage of 300 kV and equipped with an EDAX energy dispersive spectrometer (EDS). FIG. 29 illustrates the TEM image of the as-prepared $\alpha$-$MnO_2$ nanowires. As illustrated in FIG. 29, the $MnO_2$ crystals indicate a nanowire morphology with dimensions normal to the wire axis in the range of about 20 nm to about 50 nm and lengths varying between about 1 μm to about 5 μm.

Figure 30:
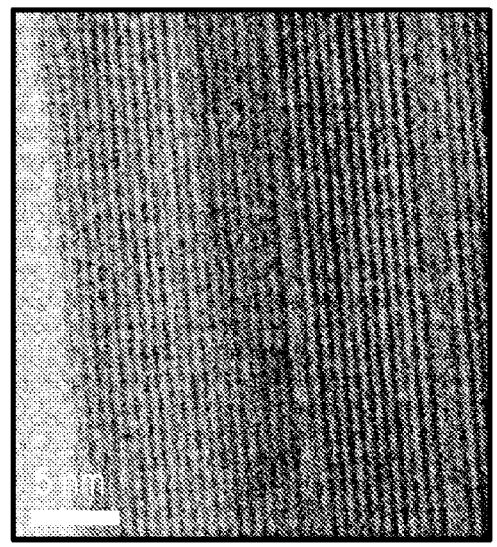
FIG. 30 illustrates a high resolution TEM lattice image of the $MnO_2$ nanowires.

FIG. 30 illustrate high resolution TEM lattice image of the $\alpha$-$MnO_2$ nanowires. Alpha-$MnO_2$ structures are based on a tunnel structure formed by double edge-sharing $MnO_6$ octahedral forming square tunnels in cross-section perpendicular to the c-axis, where the tunnels are running parallel to the c-axis. The image in FIG. 30, illustrates a view along the diagonal of the tunnels. Stacking defects with dimensions of 1.0 nm and 1.3 nm, respectively normal to the c-axis are visualized in FIG. 30, which can be interpreted as wider tunnels formed by a different number of edge-sharing $MnO_6$ octahedra.

Figure 32:
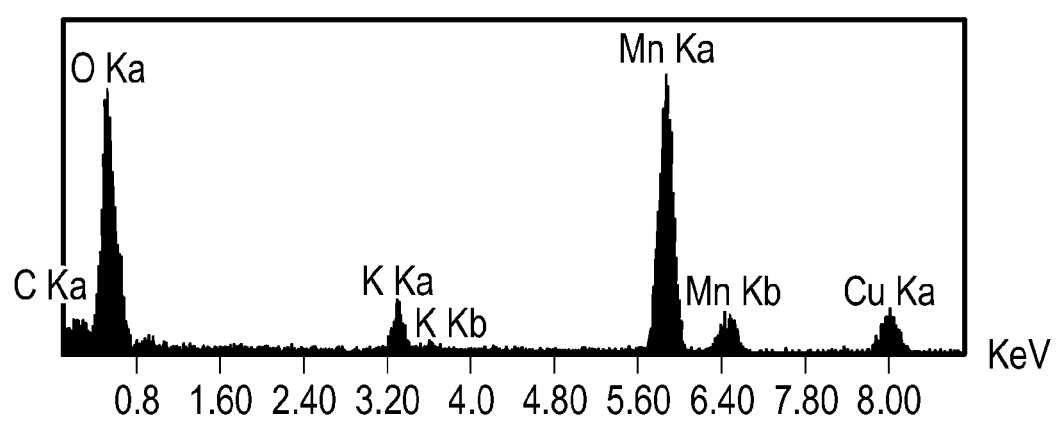
FIG. 32 illustrates the EDS spectrum of a single $MnO_2$ nanowire.

EDS analysis was performed on a single $MnO_2$ nanowire to further confirm its composition. FIG. 32 illustrates the EDS spectrum of the as-prepared alpha-manganese (IV) oxide nanowires. FIG. 32 illustrates the presence of the main component manganese (Mn), oxygen (O), along with minor amounts of potassium (K), which can be interpreted as the formation of a limited solid solution between cryptomelane and $\alpha$-$MnO_2$. The copper (Cu) and calcium (C) peaks are background from the TEM support grid.

Selected Area Diffraction (SAD) Pattern of the Manganese (IV) Oxide Nanowires.

Figure 31:
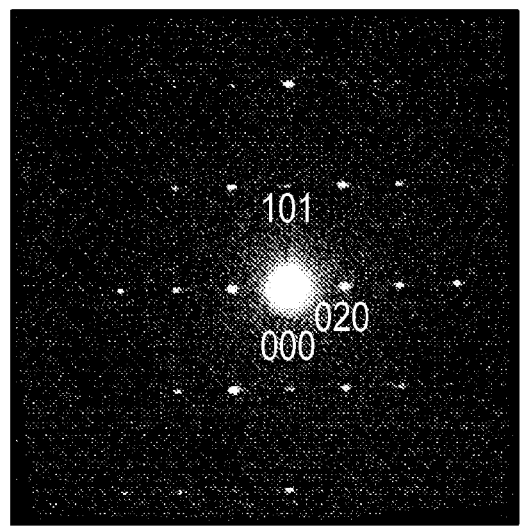
FIG. 31 illustrates the selected area diffraction (SAD) pattern of a single $MnO_2$ nanowire

Selected area diffraction (SAD) pattern of the as-prepared alpha-manganese (IV) oxide nanowires is determined FIG. 31 illustrates the SAD pattern of a single $MnO_2$ nanowire. The $MnO_2$ nanowire can be indexed as the zone axis of tetragonal oi-$MnO_2$ or cryptomelane, which is isostructural with $\alpha$-$MnO_2$.

Forming Manganese (IV) Oxide Anchored Graphene and Carbon Nanotube Hybrid Foam ("Hybrid Foam")

Nickel foam (e.g., a porous metal substrate) having a thickness of 0.5 mm is cleaned and annealed to make sure the surface is substantially free contaminations, release the residue stress in the foam, enlarge the average grain size, and also flattens the surface. A reactive ion etching $O_2$-plasma is applied and 1-5 nm Fe catalysts are deposited on the surface of plasma treated nickel foam by e-beam evaporation (Temescal, BJD-1800). The as-prepared nickel foam is heated to 750° C. under ambient pressure in an Ar/$H_2$ atmosphere, and acetylene is introduced to trigger and continue the growth of graphene and carbon nanotubes synchronously on the nickel foam frame to form a coated porous metal substrate. After growth, the chamber is cooled to the room temperature (25 degrees Celsius) at an average cooling rate of 50 degrees Celsius per minute.

The $MnO_2$ nanowires are dispersed in ethanol to form a slurry. The coated porous metal substrate is submerged into the slurry including the $MnO_2$ nanowires and to deposit the $MnO_2$ nanowires onto a surface of the coated porous substrate to form a hybrid foam including $MnO_2$ nanowires. After the $MnO_2$ nanowires are deposited, the hybrid foam is dried at 110° C. for 1 hour and annealed at 150° C. for 6 hours under vacuum.

Figure 24:
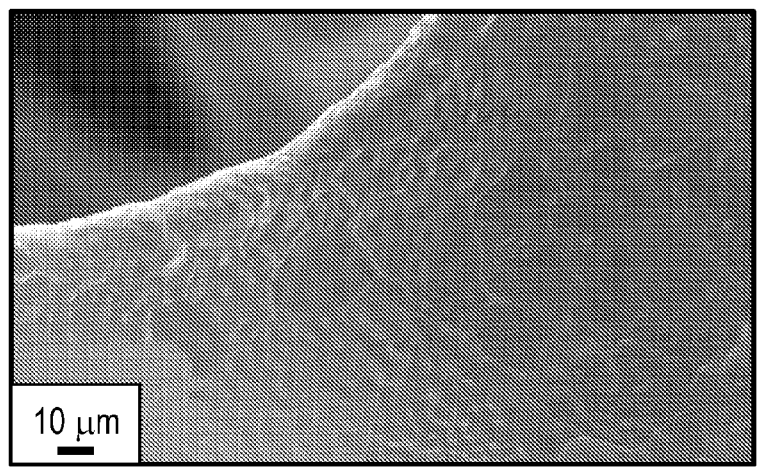
FIG. 24 illustrates a SEM image of pristine nickel foam.
Figure 25:
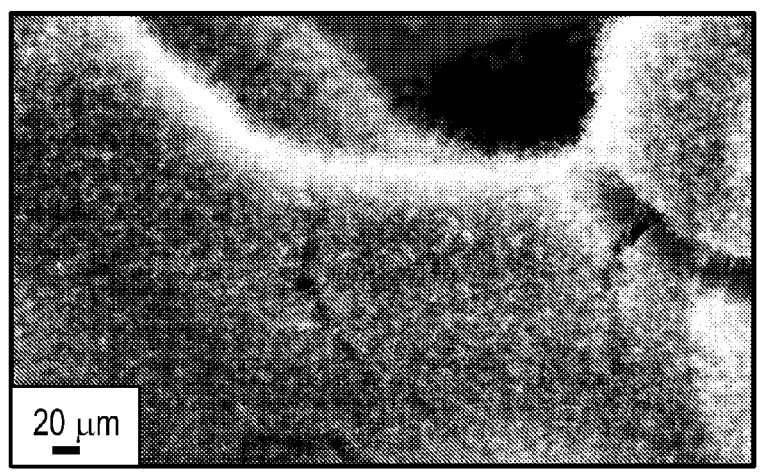
FIG. 25 illustrates a SEM image of a coated porous metal substrate.
Figure 26:
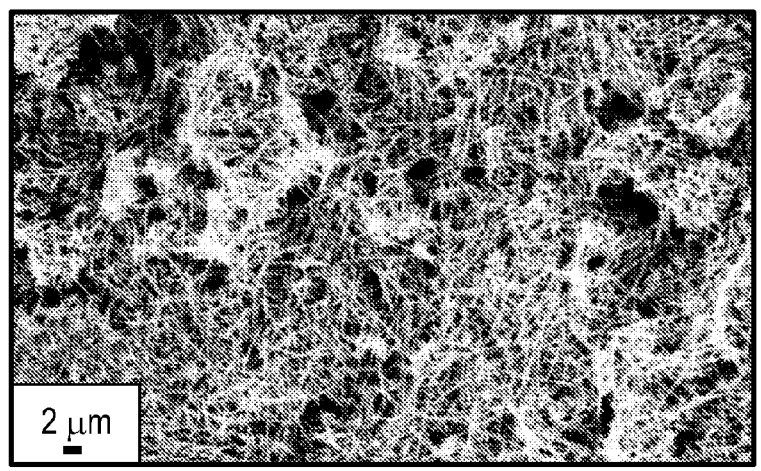
FIG. 26 illustrates a SEM image of a hybrid foam including $MnO_2$ nanowires.

The loading mass of active material can be simply controlled with various growth conditions of the CVD process including time, catalyst amount and carbon source concentration and also the concentration of the $MnO_2$ solution bath and time of deposition. It is important to note that the loading mass in this work is the total weight of the at least one graphene layer, the plurality of carbon nanostructures, and $MnO_2$ nanowires, which can be obtained by measuring the weight change of the nickel foam before and after loading SEM images are shown to illustrate the structural and morphological properties of the pristine nickel foam, the coating porous metal substrate, and the hybrid foam, respectively FIGS. 24-26. FIG. 24 illustrates a SEM image of pristine nickel foam and shows the locally very clean and uniform morphology of pristine nickel foam with an average grain size of 20 μm. FIG. 25 illustrates a SEM image of the coated porous metal substrate. That is, the nickel foam including the at least one graphene layer and a plurality of carbon nanotubes. FIG. 25 shows the very porous coated porous metal substrate with densely packed and randomly oriented carbon nanotubes which possess a very large surface area. FIG. 26 illustrates a SEM image of a hybrid foam including $MnO_2$ nanowires. As illustrated in FIG. 26, the $MnO_2$ nanowires are homogeneously and densely attached to the surface of the coated porous metal substrate, which successfully resulted in the graphene/carbon nanotube/metal oxide hybrid nanostructure.

Energy Dispersive Spectroscopy (EDS) Microanalysis of the Hybrid Foam

Figure 27:
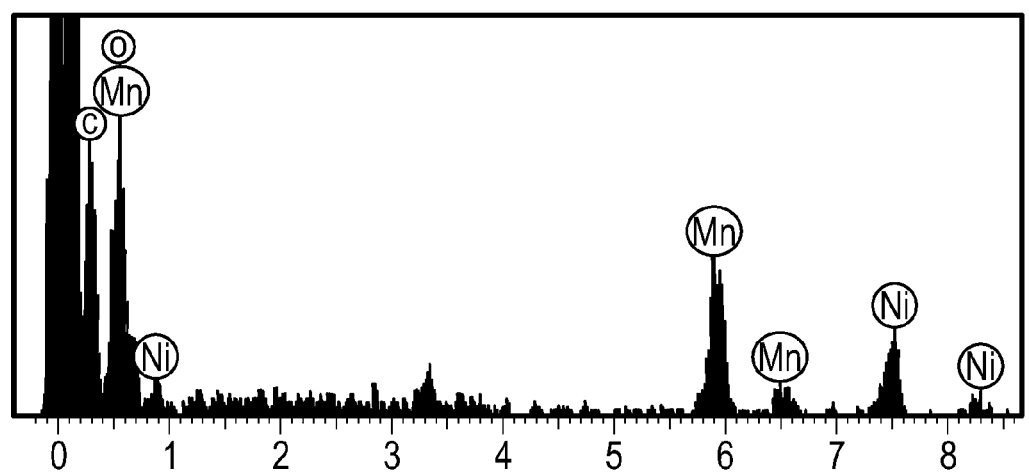
FIG. 27 illustrates the EDS microanalysis of the hybrid foam including $MnO_2$ nanowires.

FIG. 27 illustrates the EDS microanalysis of the hybrid foam including the $MnO_2$ nanowires. The microanalysis indicates that the hybrid foam consists of Mn, O, C, Ni, K. The EDS analysis suggests a weight percentage ratio of 1:2 for Mn and O which indicates the hybrid foam surface is densely populated with $MnO_2$ nanowires.

Example 2

Forming the Supercapacitor Including the Hybrid Foam Having Manganese (IV) Oxide Nanowires Two symmetrical rectangular hybrid foams including manganese (IV) oxide nanowires were fabricated as described herein. The two hybrid foams were spaced apart by a porous separator (Celgard 3501; available from Celgard). Lithium sulfate (2 molar) was used as the electrolyte.

Comparative Example 3

Comparative Example 3 includes pristine nickel foam with manganese (IV) oxide nanowires deposited onto the surface. The $MnO_2$ nanowires are mixed with 2% PVDF binder in NMP as the solvent and deposited onto the surface of the pristine nickel foam.

Comparative Example 4

Comparative Example 4 includes nickel foil with deposited $MnO_2$ nanowires. The $MnO_2$ nanowires are mixed with 2% PVDF binder in NMP as the solvent and deposited onto the surface of the nickel foil.

Cyclic Voltammetry (CV) Measurements of Example 2

Figure 33:
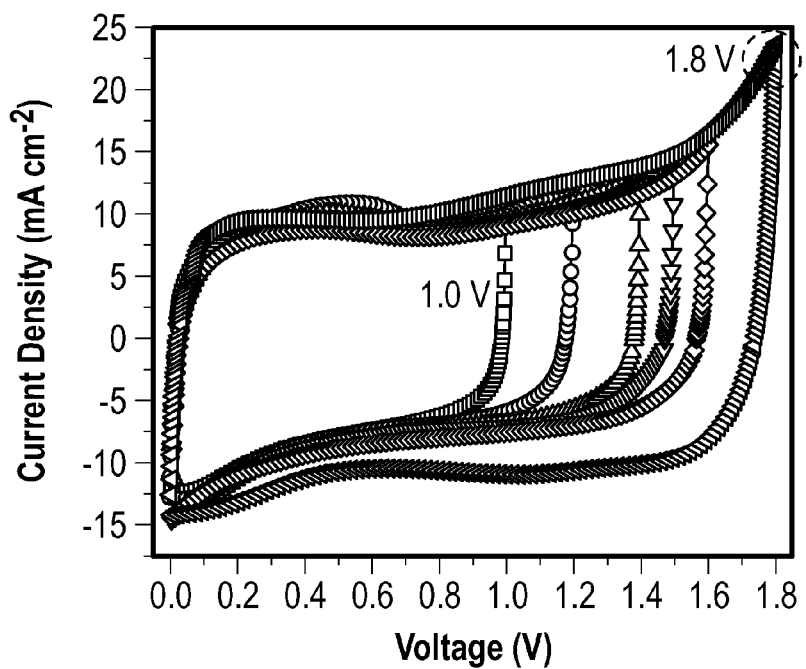
FIG. 33 illustrates a cyclic voltammetry plot for Example 2 over different potential windows with a scan rate of 50 mV $sec^{-1}$.

Cyclic voltammetry (CV) measurements of Example 2 were conducted at scanning grates between 2.5 mV $sec^{-1}$ and 1000 mV $sec^{-1}$ in lithium sulfate (2 M) to estimate the capacitance and determine the useable voltage window. FIG. 33 illustrates a cyclic voltammetry plot for Example 2 over different potential windows with a scan rate of 50 mV $sec^{-1}$. FIG. 33 shows the CV characteristics of the supercapacitor including the hybrid foam with a range of operation voltage windows. With higher potential limits, more $MnO_2$ is involved in the redox process. As illustrated in FIG. 33, if the voltage window is increased beyond 1.8 V, an increasing amount of irreversible charge is passed. These results suggest that the operation of this type of supercapacitor with an operation voltage window of 1.6 V is feasible, which is greater than the majority of aqueous electrolyte supercapacitors (~1.0 V).

Figure 34:
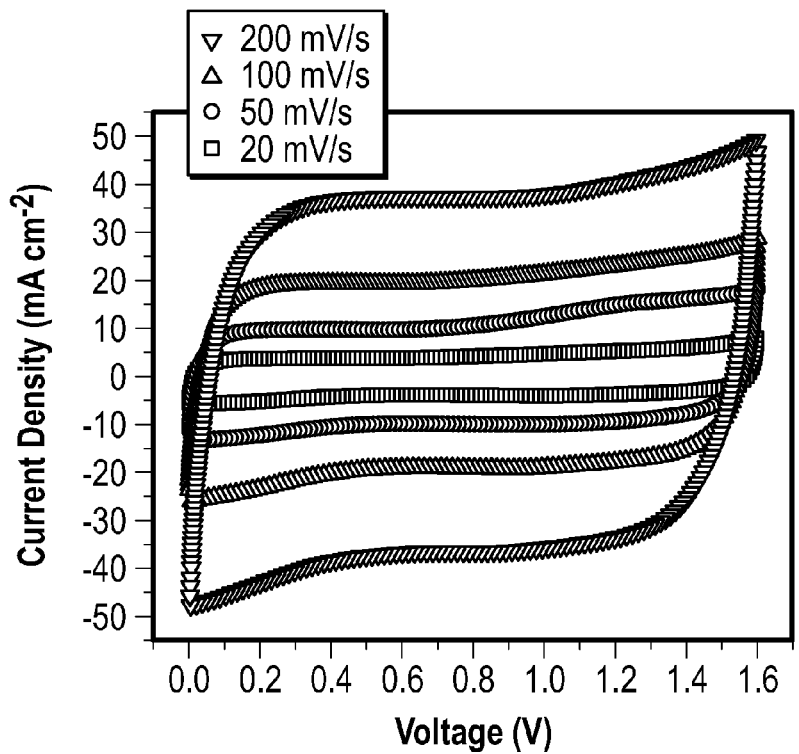
FIG. 34 illustrates a cyclic voltammetry (CV) plot for Example 2 under different scan rates.

FIG. 34 illustrates a cyclic voltammetry plot for Example 2 under different scan rates. The cyclic voltammetry measurements for Example 2 are performed at scanning rates of 20 mV $sec^{-1}$, 50 mV $sec^{-1}$, 100 mV $sec^{-1}$, and 200 mV $sec^{-1}$. FIG. 34 illustrates near rectangular CV characteristics of Example 2 with an operational voltage window of 1.6 V. The nearly rectangular shape and the absence of oxidation and reduction peaks are observed for all scan rates suggesting that the supercapacitor of Example 2 has a small equivalent series resistance, high rate handling ability, and excellent electrochemical performance. Moreover, the nearly mirror-image shape of the CV curves indicates exceptional reversibility a fast surface reaction.

Figure 35:
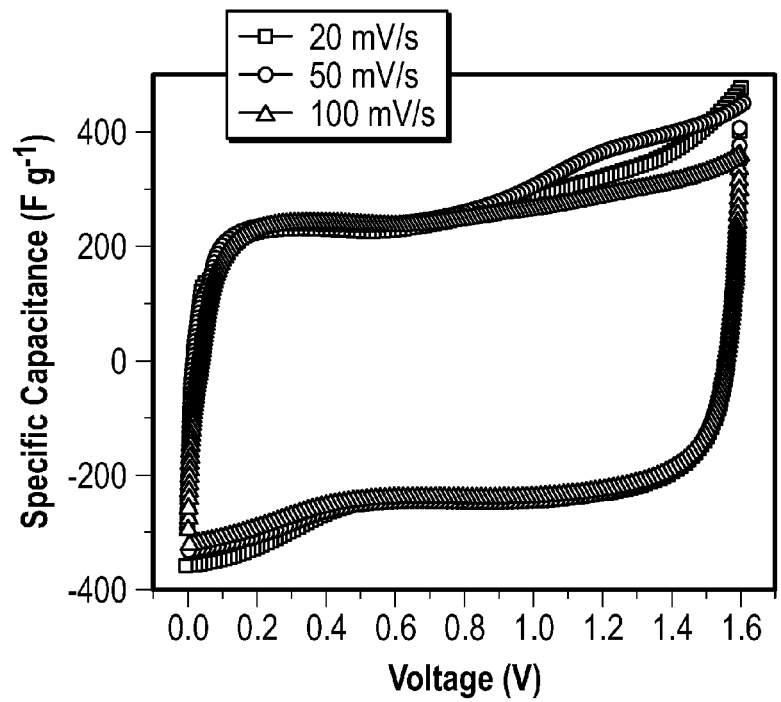
FIG. 35 illustrates normalized CV plots of Example 2 under different scan rates.

FIG. 35 illustrates normalized CV plots of Example 2 under different scan rates. The nearly identical specific capacitance characteristics for different scan rates further indicate outstanding process stability, repeatability, and superior performance of the supercapcitor of Example 2.

Chronopotentiometry (Charge-Discharge) Measurements of Example 2

Figure 36:
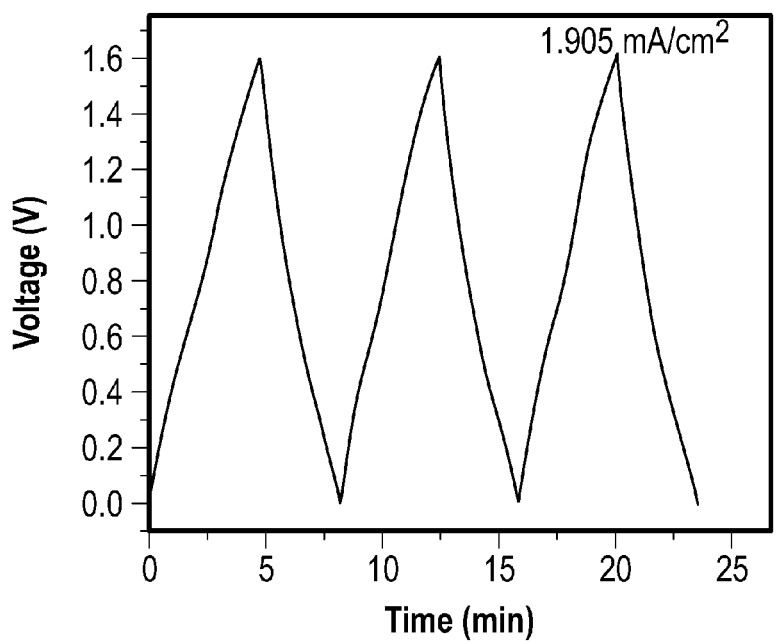
FIG. 36 illustrates a charge-discharge curve of Example 2 at a single current density.

Chronopotentiometry measurements were conducted with an operational window of 1.6 V at a current density of 1.905 mA cm$^{-2}$ to further evaluate the electrochemical performance of the supercapacitor of Example 2. FIG. 36 illustrates the charge-discharge characteristics of Example 2 over at a single current density. The near linear and symmetric charge and discharge curves suggest an excellent capacitive performance with a rapid current-voltage (I-V) response for Example 2.

Figure 37:
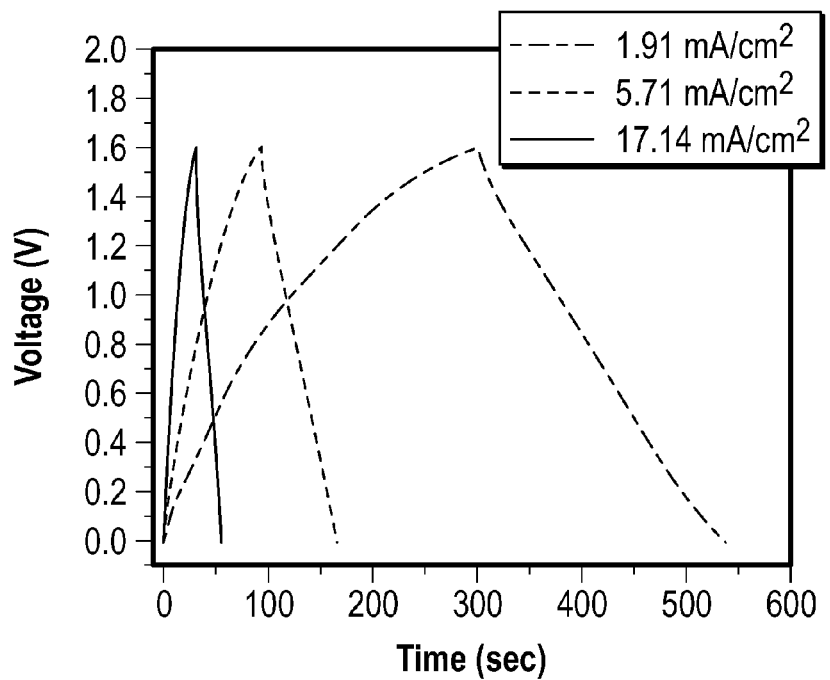
FIG. 37 illustrates charge-discharge curves of Example 2 over different current densities.
Figure 38:
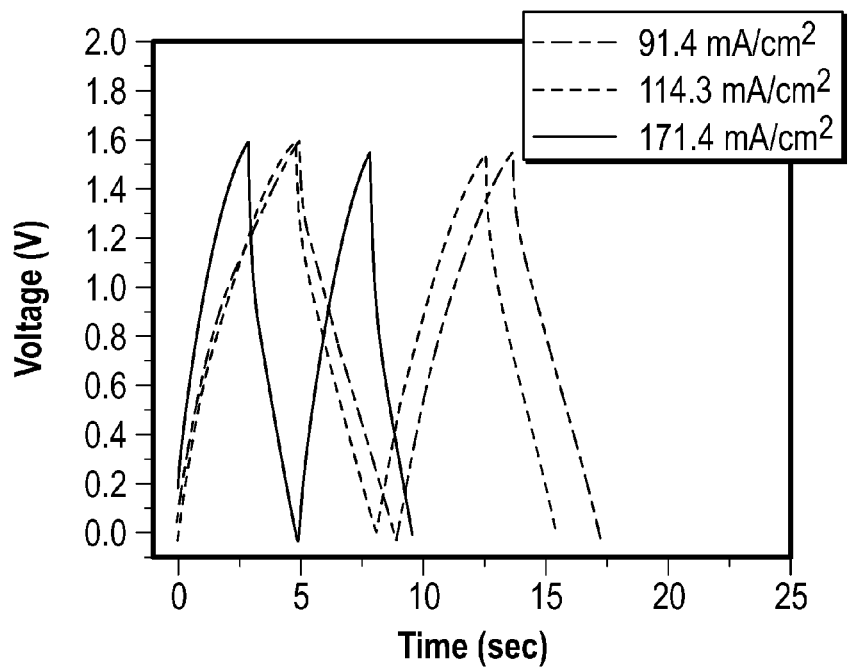
FIG. 38 illustrates charge-discharge curves of Example 2 over different current densities.

FIG. 37 and FIG. 38 illustrate charge-discharge curves of Example 2 over different current densities.

Specific Capacitance of Example 2

Figure 39:
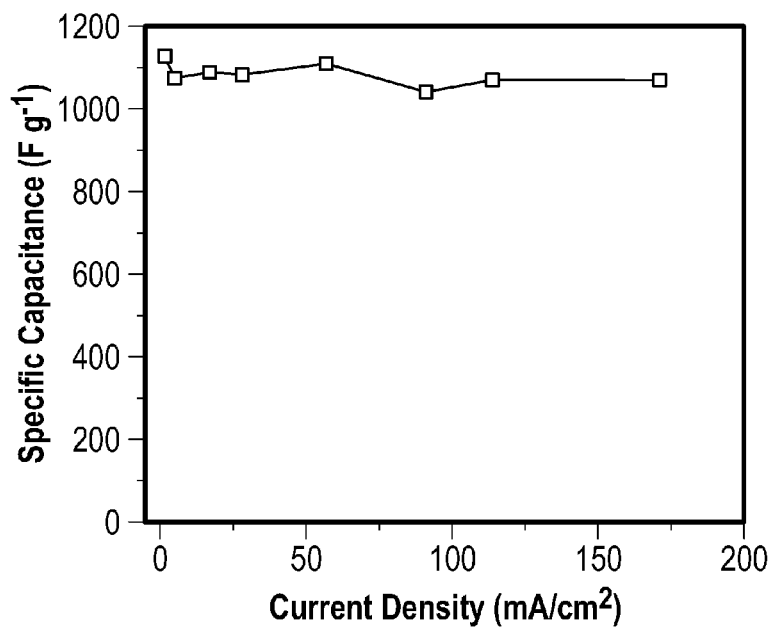
FIG. 39 illustrates the specific capacitance and per-area capacitance of Example 2.

Specific capacitance ($C_s$) values were calculated from the charge-discharge curves in FIGS. 37 and 38 via equation (1) $C_s$=2i/m(dv/dt), where m is the carbon mass of one electrode (e.g., hybrid foam), i is the discharge current and dV/dt is the slope of the discharge curve. FIG. 39 illustrates the specific capacitance and per-area capacitance of Example 2 under different current densities below 180 mA cm$^{-2}$. The highest specific capacitance of 1101.65 F g$^{-1}$ is obtained at a current density of 1.905 mA cm$^{-2}$. The high capacitance retention for even higher charge/discharge current densities further confirms the excellent high rate handability for Example 2.

Cyclic Stability of Example 2, Comparative Example 3, and Comparative Example 4

Figure 40:
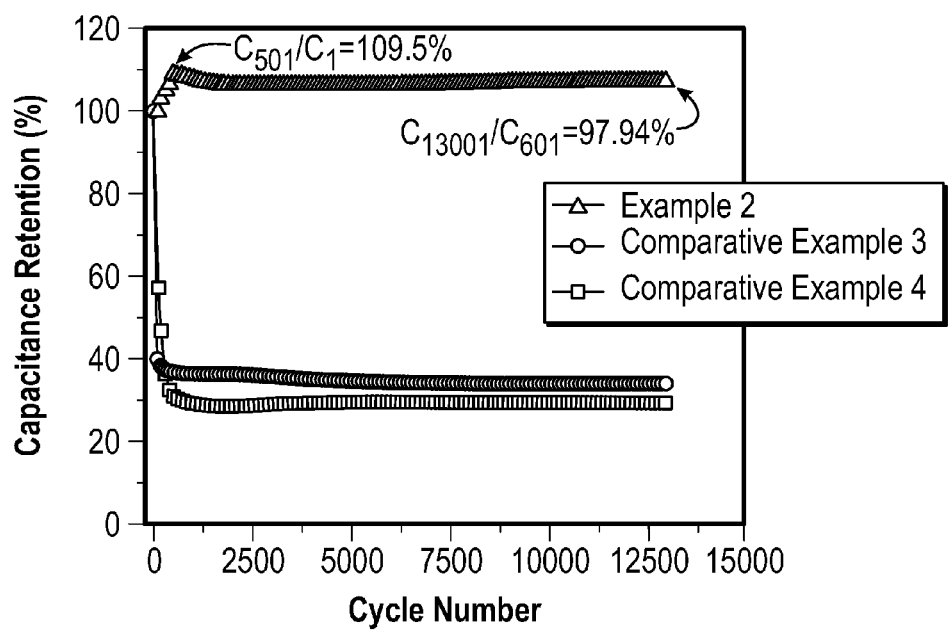
FIG. 40 illustrates the cyclic stability of Example 2, Comparative Example 3, and Comparative Example 3.

Having a long cycling life is an important factor for the application of supercapacitor electrodes. A test sequence of 13000 charge-discharge cycles for Example 2 (Voltage window 1.6 V) and Comparative Example 3 (Voltage window 1.0 V) and Comparative Example 4 (Voltage window 1.0 V) are carried out with a current density of 48 mA cm$^{-2}$. FIG. 40 illustrates the cyclic stability of Example 2, Comparative Example 3, and Comparative Example 3. After 13000 cycles, superior capacitance retention (about 97.94%) was maintained for Example 2 compared to Comparative Example 3 (about 35% capacitance retention) and Comparative Example 4 (about 30% capacitance retention). Example 2 demonstrates excellent electrochemical performance of this type of nanocarbon/metal hybrid nanostructure foam for applications in practical energy storage devices.

Within the first 500 hundred cycles, a slight capacitance increase to about 109.5% is observed. The slight capacitance enhancement (about 9.5%) of Example 2 within the first 500 hundred cycles can be due to the increased effective interfacial area between the hybrid foam and the electrolyte with an increase of reaction time. This self-strengthening effect can also help to stabilize the supercapacitor in long term operation.

Potentiostatic Electrochemical Impedance Spectroscopy Measurements of Example 2

Figure 41:
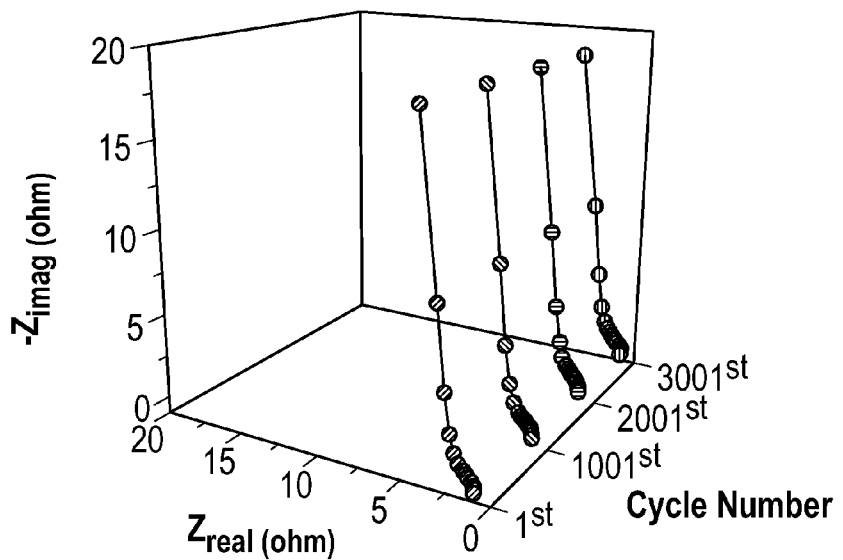
FIG. 41 illustrates an electrochemical impedance spectroscopy plot of Example 2.

Potentiostatic electrochemical impedance spectroscopy (EIS) measurements were performed on Example 2 to further characterize the performance of the supercapacitor of Example 2. The potentiostatic EIS measurements were performed after 1$^{st}$, 1001$^{th}$, 2001$^{th}$, 3001$^{th}$ cycles to evaluate the internal resistance change during the charge-discharge cycling. FIG. 41 illustrates an EIS plot of Example 2. The EIS plots show a near linear and vertical characteristic and a series of constant spectra with an identical equivalent series resistance around 1Ω for the EIS measurements after 1$^{st}$, 1001$^{th}$, 2001$^{th}$ and 3001$^{th}$ cycles, which further demonstrates an exceptional electrochemical cycling stability of the hybrid foam. The excellent cycling performance achieved in Example 2 can be attributed to the graphene layer facilitating charge transfer between intertwined carbon nanotube—MnO$_2$ nanowire network layer and the current collector (nickel foam).

Figure 42:
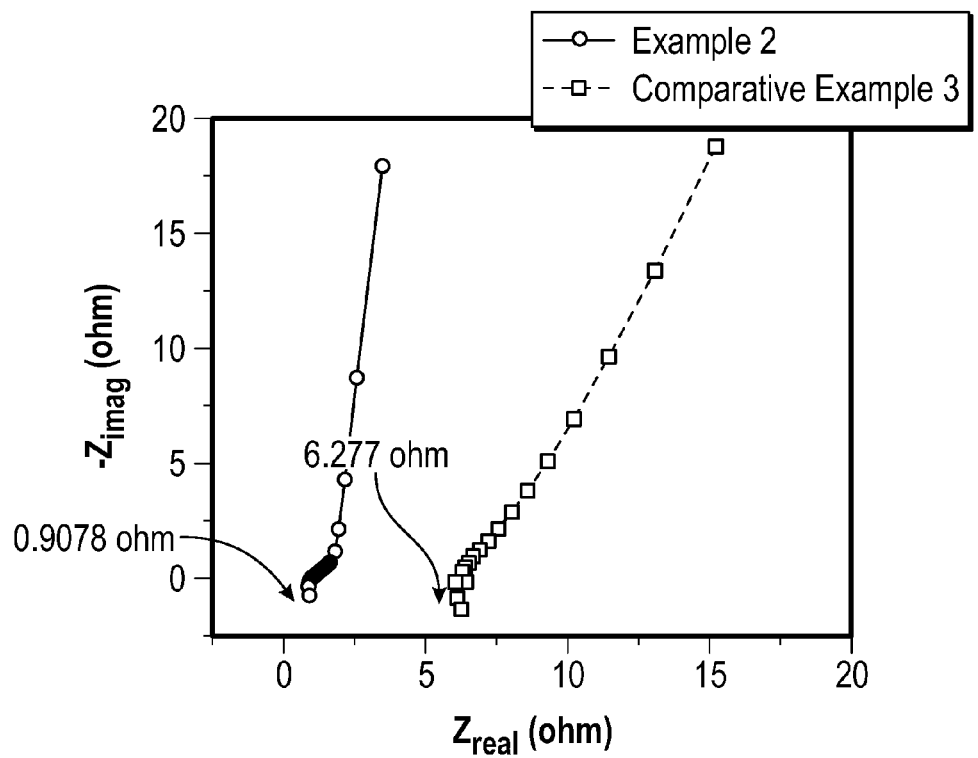
FIG. 42 illustrates an electrochemical impedance spectroscopy plot of Example 2 and Comparative Example 4.

FIG. 42 illustrates an electrochemical impedance spectroscopy plot of Example 2 and Comparative Example 3. Compared to Comparative Example 3 having an ESR of about 6.28Ω, a much lower ESR is achieved with Example 2 (about 0.9 ohm), which is about a 600% improvement.

Ragon Plots

Figure 43:
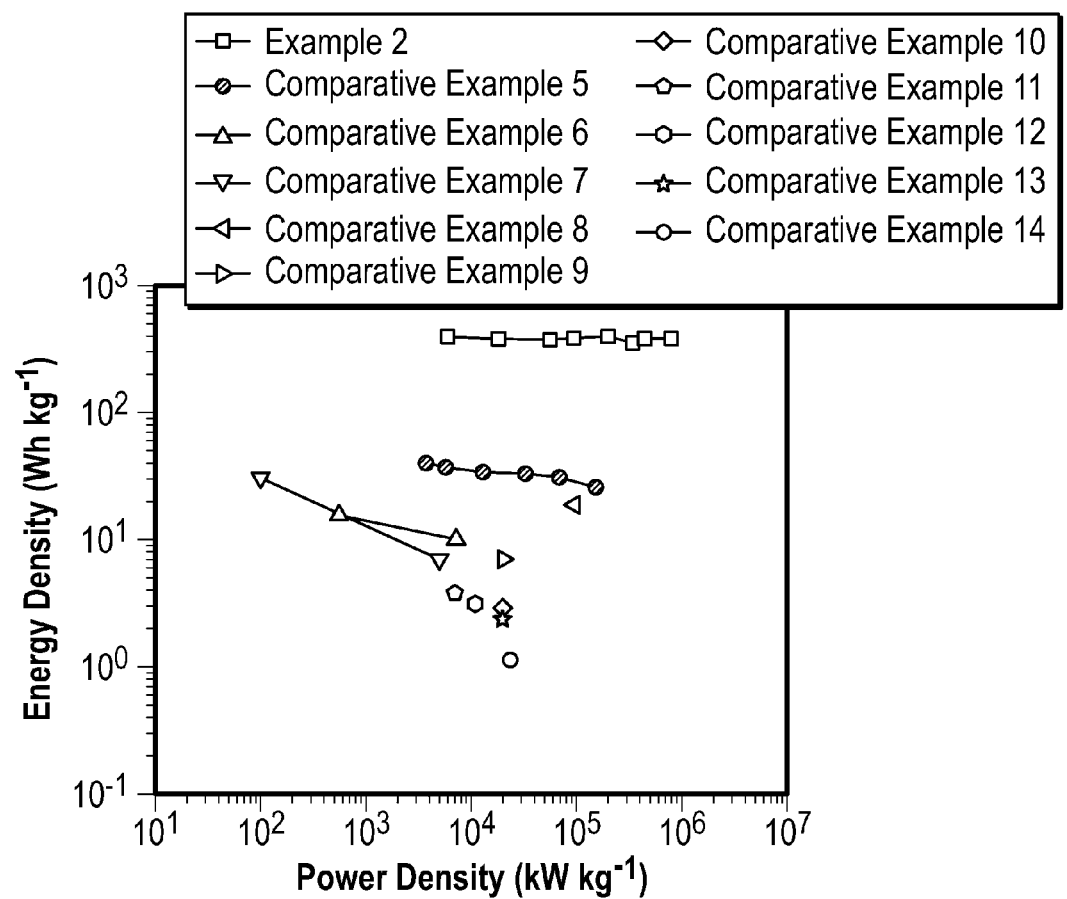
FIG. 43 illustrates a Ragon plot related to energy densities and power densities for different supercapacitor systems.

FIG. 43 illustrates a Ragon plot related to energy densities and power densities for different supercapacitor systems. The energy density and power density are based on the chronopotentiometry measurements results. The energy density (E) and power density (P) are calculated by using equations (x) and (x):

$$E = \frac{1}{2}C_s(\Delta V)^2$$

And $$P = \frac{E}{t}$$

where t is the total time of discharge, $C_s$ is the specific capacitance value from charge-discharge, and $\Delta V$ is the potential range which is 1.0 V for aqueous normally.

Example 2 exhibits a high energy density of 391.7 Wh kg$^{-1}$ at 6.04 kW kg$^{-1}$, which gradually reduces to 377.7 Wh kg$^{-1}$ at 799.84 kW kg$^{-1}$. These results are higher compared to previously reported systems like Comparative Example 5 (graphene/carbon nanotube foams), Comparative Example 6 (graphene films), Comparative Example 7 (MnO$_2$ nanowire/graphene), Comparative Example 8 (single-wall carbon nanotubes (SWNT)/RuO$_2$ nanowires), Comparative Example 9 (SWNT with a non-aqueous electrolyte)), Comparative Example 10 (multi-wall carbon nanotubes (MWNTs)), Comparative Example 11 (vertically aligned MWNTs), Comparative Example 12 (polyaniline (PANI)), Comparative Example 13 (polypyrrole (PPy)), and Comparative Example 14 (Poly(ethylenedioxythiophene) (PEDOT)). The indicated energy density and power density values are based on the mass of the active materials of the electrodes.

Summary

In summary, a hybrid foam has been demonstrated, which was prepared by ambient pressure chemical vapor deposition of graphene/multi-wall carbon nanotube foam structure and simple bath deposition of MnO$_2$ nanowires. This method of preparing electrodes offers a facile, scalable and a low-cost approach for high energy density supercapacitor applications. The two-step process successfully renders the conformal coating of α-MnO$_2$ nanowires on the graphene/multi-wall carbon nanotubes backbone to form an intertwined network between multi-wall carbon nanotubes and MnO$_2$ nanowires. Such integration of metal oxide nanostructures with the graphene/multi-wall carbon nanotube foam structure resulted in exceptional capacitive ability and high conductivity of the electrodes. The low density, excellent ductility, high electrochemical stability (~(about 100% capacitance retention over 13,000 cycles) and excellent capacitive performance (specific capacitance: 1101.65 F g$^{-1}$, Energy density: 391.7 Wh kg$^{-1}$, Power density: 799.84 kW kg$^{-1}$) suggests the hybrid foam can advantageous over previous supercapacitors.

Various Notes & Examples

To further describe the methods and hybrid carbon nanotube and graphene nanostructures disclosed herein, a non-limiting list of examples is provided here:

In Example 1, an energy device comprises a porous metal substrate; at least one graphene layer deposited onto a surface of the porous metal substrate; a plurality of carbon nanotubes grown onto a surface of the at least one graphene layer; and a plurality of metal oxide nanostructures deposited onto at least one of a surface of the plurality of carbon nanotubes and the surface of the at least one graphene layer.

In Example 2, the subject matter of Example 1 can optionally be configured such that the plurality of metal oxide nanostructures includes at least one of ruthenium (IV) oxide and manganese (IV) oxide.

In Example 3, the subject matter of any one or any combination of Examples 1 or 2 can optionally be configured such that the plurality of metal oxide nanostructures includes at least one of ruthenium (IV) oxide nanoparticles, ruthenium (IV) oxide nanoplates, and ruthenium (IV) oxide nanowires.

In Example 4, the subject matter of any one or any combination of Examples 1 through 3 can optionally be configured such that the plurality of metal oxide nanostructures includes manganese (IV) oxide nanowires.

In Example 5, the subject matter of any one or any combination of Examples 1 through 4 can optionally be configured such that the porous metal substrate includes at least of copper, aluminum, and nickel.

In Example 6, the subject matter of any one or any combination of Examples 1 through 5 can optionally be configured such that the energy device does not include a binder.

In Example 7, the subject matter of any one or any combination of Examples 1 through 6 can optionally be configured such that the at least one graphene layer includes less than twenty graphene layers.

In Example 8, the subject matter of any one or any combination of Examples 1 through 7 can optionally be configured such that a loading mass of the energy device is within a range of about 0.0005 grams to about 0.1 grams.

In Example 9, the subject matter of any one or any combination of Examples 1 through 8 can optionally be configured such that the loading mass is determined by a difference between a mass of a post-loaded porous metal substrate and a mass of pre-loaded porous metal substrate.

In Example 10, the subject matter of any one or any combination of Examples 1 through 9 can optionally be configured such that the post-loaded porous metal substrate includes the porous metal substrate, the at least one graphene layer, the plurality of carbon nanotubes, and the plurality of metal oxide nanostructures and the pre-loaded porous metal substrate includes the porous metal substrate.

In Example 11, a supercapacitor can comprise a first electrode including: a first porous metal substrate, at least one graphene layer deposited onto a surface of the first porous metal substrate, a plurality of carbon nanotubes grown onto a surface of the at least one graphene layer, and a plurality of metal oxide nanostructures deposited onto at least one of a surface of the plurality of carbon nanotubes and the surface of the at least one graphene layer. The supercapacitor can include a second electrode, including: a second porous metal substrate, at least one graphene layer deposited onto a surface of the second porous metal substrate, a plurality of carbon nanotubes grown onto at least one of a surface of the at least one graphene layer, and a plurality of metal oxide nanostructures deposited onto at least one of a surface of the plurality of carbon nanotubes and the surface of the at least one graphene layer. The supercapacitor can include an electrolyte; and a separator positioned between the first electrode and the second electrode.

In Example 12, the subject matter of any one or any combination of Examples 1 through 11 can optionally be configured such that the first porous metal substrate and the second porous metal substrate includes at least one of copper, aluminum, and nickel.

In Example 13, the subject matter of any one or any combination of Examples 1 through 12 can optionally be configured such that the plurality of metal oxide nanostructures includes at least one of ruthenium (IV) oxide and manganese (IV) oxide.

In Example 14, the subject matter of any one or any combination of Examples 1 through 13 can optionally be configured such that the at least one graphene layer includes twenty graphene layers or less.

In Example 15, the subject matter of any one or any combination of Examples 1 through 14 can optionally be configured such that the first electrode and the second electrode do not include a binder.

In Example 16, a method can comprise growing at least one graphene layer onto a surface of a porous metal substrate using chemical vapor deposition; growing a plurality of carbon nanotubes onto a surface of the at least one graphene layer using chemical vapor deposition to form a coated porous metal substrate; and depositing a plurality of metal oxide nanostructures onto a surface of the coated porous metal substrate to form a hybrid foam.

In Example 17, the subject matter of any one or any combination of Examples 1 through 16 can optionally be configured to include prior to growing the at least one graphene layer and the plurality of carbon nanotubes, the method comprises: applying a reactive ion etching plasma to the porous metal surface; and depositing catalyst particles onto the surface of the porous metal surface.

In Example 18, the subject matter of any one or any combination of Examples 1 through 16 can optionally be configured to include treating the coated porous metal substrate with ultraviolet-generated ozone for a time period.

In Example 19, the subject matter of any one or any combination of Examples 1 through 18 can optionally be configured such that depositing the plurality of metal oxide nanostructures includes submerging the coated porous metal substrate into one of a first solution including hydrous ruthenium (IV) oxide nanostructures and deionized water and a second solution including alpha-manganese (IV) oxide nanowires and ethanol.

In Example 20, the subject matter of any one or any combination of Examples 1 through 19 can optionally be configured to include drying the hybrid foam at a first temperature for a first time period; and annealing the hybrid foam at a second temperature for a second time period.

These non-limiting examples can be combined in any permutation or combination. The above Detailed Descrip- The claimed invention is:

1. An energy device, comprising
   a porous metal substrate;
   at least one graphene layer deposited onto a surface of the porous metal substrate;
   a plurality of carbon nanotubes grown onto a surface of the at least one graphene layer; and
   a plurality of hydrous ruthenium (IV) oxide nanowires deposited onto the plurality of carbon nanotubes.

2. The energy device of any one claim 1, wherein the porous metal substrate includes at least of copper, aluminum, and nickel.

3. The energy device of claim 1, wherein the energy device does not include a binder.

4. The energy device of claim 1, wherein the at least one graphene layer includes less than twenty graphene layers.

5. The energy device of claim 1, wherein a loading mass of the energy device is within a range of about 0.0005 grams to about 0.1 grams.

6. The energy device of claim 5, wherein the loading mass is determined by a difference between a mass of a post-loaded porous metal substrate and a mass of pre-loaded porous metal substrate.

7. The energy device of claim 6, wherein the post-loaded porous metal substrate includes the porous metal substrate, the at least one graphene layer, the plurality of carbon nanotubes, and the plurality of metal oxide nanowires and the pre-loaded porous metal substrate includes the porous metal substrate.

8. A supercapacitor, comprising:
   a first electrode including:
   a first porous metal substrate,
   at least one graphene layer deposited onto a surface of the first porous metal substrate,
   a plurality of carbon nanotubes grown onto a surface of the at least one graphene layer, and
   a plurality of metal oxide nanowires deposited onto the plurality of carbon nanotubes;
   a second electrode, including:
   a second porous metal substrate,
   at least one graphene layer deposited onto a surface of the second porous metal substrate,
   a plurality of carbon nanotubes grown onto at least one of a surface of the at least one graphene layer, and
   a plurality of hydrous ruthenium (IV) oxide nanowires deposited onto the plurality of carbon nanotubes;
   an electrolyte; and
   a separator positioned between the first electrode and the second electrode.

9. The supercapacitor of claim 8, wherein the first porous metal substrate and the second porous metal substrate includes at least one of copper, aluminum, and nickel.

10. The supercapacitor of claim 8, wherein the at least one graphene layer includes twenty graphene layers or less.

11. The supercapacitor of claim 8, wherein the first electrode and the second electrode do not include a binder.

12. A method, comprising:
    growing at least one graphene layer onto a surface of a porous metal substrate using chemical vapor deposition;
    growing a plurality of carbon nanotubes onto a surface of the at least one graphene layer using chemical vapor deposition to form a coated porous metal substrate; and
    depositing a plurality of hydrous ruthenium (IV) oxide nanowires onto a surface of the plurality of carbon nanotubes to form a hybrid foam.

13. The method of claim 12, wherein, prior to growing the at least one graphene and the plurality of carbon nanotubes, the method comprises:
    applying a reactive ion etching plasma to the porous metal surface; and
    depositing catalyst particles onto the surface of the porous metal surface.

14. The method of claim 12, comprising treating e coated porous metal substrate with ultraviolet-generated ozone for a time period.

15. The method of claim 12, comprising:
    drying the hybrid foam at a first temperature for a first time period; and
    annealing the hybrid foam at a second temperature for a second time period.

\* \* \* \* \*